United States Patent
Kim et al.

(10) Patent No.: US 11,657,858 B2
(45) Date of Patent: *May 23, 2023

(54) NONVOLATILE MEMORY DEVICES INCLUDING MEMORY PLANES AND MEMORY SYSTEMS INCLUDING THE SAME

(71) Applicant: Samsung Electronics Co., Ltd., Suwon-si (KR)

(72) Inventors: Hyun-Jin Kim, Hwaseong-si (KR); Chung-Ho Yu, Hwaseong-si (KR); Yong-Kyu Lee, Hwaseong-si (KR); Jae-Yong Jeong, Yongin-si (KR)

(73) Assignee: Samsung Electronics Co., Ltd.

( * ) Notice: Subject to any disclaimer, the term of this patent is extended or adjusted under 35 U.S.C. 154(b) by 9 days.

This patent is subject to a terminal disclaimer.

(21) Appl. No.: 17/338,097

(22) Filed: Jun. 3, 2021

(65) Prior Publication Data

US 2021/0295884 A1     Sep. 23, 2021

Related U.S. Application Data

(63) Continuation-in-part of application No. 16/432,959, filed on Jun. 6, 2019, now Pat. No. 11,037,626.

(30) Foreign Application Priority Data

Nov. 28, 2018   (KR) .................. 10-2018-0150016

(51) Int. Cl.
*G11C 7/10*     (2006.01)

(52) U.S. Cl.
CPC .......... *G11C 7/1039* (2013.01); *G11C 7/1012* (2013.01); *G11C 7/1057* (2013.01); *G11C 7/1084* (2013.01)

(58) Field of Classification Search
CPC ... G11C 7/1084; G11C 7/1057; G11C 7/1012; G11C 7/1039

(Continued)

(56) References Cited

U.S. PATENT DOCUMENTS 5,473,758 A    12/1995  Allen et al.
6,426,901 B2    7/2002  Wada (Continued)

FOREIGN PATENT DOCUMENTS

JP          20030338181 A     5/2002

*Primary Examiner* — Sung Il Cho
(74) *Attorney, Agent, or Firm* — Myers Bigel, P.A.

(57) ABSTRACT

A nonvolatile memory device may include a plurality of memory planes and a plurality of plane-dedicated pad sets. The plurality of memory planes may include a plurality of memory cell arrays including nonvolatile memory cells and a plurality of page buffer circuits. Each of the plurality of page buffer circuits may be connected to ones of the nonvolatile memory cells included in each of the plurality of memory cell arrays through bitlines. A plurality of plane-dedicated pad sets may be connected to the plurality of page buffer circuits through a plurality of data paths respectively such that each of the plurality plane-dedicated pad sets is dedicatedly connected to each of the plurality of page buffer circuits. A bandwidth of a data transfer may be increased by reducing a data transfer delay and supporting a parallel data transfer, and power consumption may be decreased by removing data multiplexing and/or signal routing.

20 Claims, 27 Drawing Sheets

(58) Field of Classification Search
USPC .................................................. 365/185.12
See application file for complete search history.

(56) References Cited

U.S. PATENT DOCUMENTS

| | | | |
|---|---|---|---|
| 7,130,958 B2 | 10/2006 | Chou et al. | |
| 7,310,258 B2 | 12/2007 | Lee et al. | |
| 7,529,149 B2 | 5/2009 | Pyeon et al. | |
| 7,864,618 B2 | 1/2011 | Riho et al. | |
| 8,274,844 B2 | 9/2012 | Takahashi et al. | |
| 8,796,863 B2 | 8/2014 | Lee et al. | |
| 8,953,396 B2 | 2/2015 | Abedifard | |
| 9,053,066 B2 | 6/2015 | Ramachandra et al. | |
| 10,566,340 B1 | 2/2020 | Son et al. | |
| 2006/0268642 A1 | 11/2006 | Chen et al. | |
| 2007/0297233 A1 | 12/2007 | Maejima | |
| 2010/0214812 A1 | 8/2010 | Kim | |
| 2013/0262744 A1 | 10/2013 | Ramachandra et al. | |
| 2015/0234612 A1* | 8/2015 | Himelstein | G06F 13/00 714/6.21 |
| 2015/0262630 A1 | 9/2015 | Shirakawa et al. | |
| 2016/0012865 A1* | 1/2016 | Lee | G11C 5/04 365/51 |
| 2016/0216319 A1* | 7/2016 | Na | G11C 29/1201 |
| 2017/0017590 A1* | 1/2017 | Berman | G06F 3/0647 |
| 2017/0075829 A1 | 3/2017 | Lee et al. | |
| 2018/0211707 A1 | 7/2018 | Nosaka | |
| 2018/0277216 A1 | 9/2018 | Inoue et al. | |
| 2019/0051372 A1 | 2/2019 | Kim | |
| 2019/0188162 A1* | 6/2019 | Kwon | G06F 12/0246 |
| 2019/0259460 A1 | 8/2019 | Noro et al. | |
| 2019/0294372 A1 | 9/2019 | Lee | |
| 2019/0295602 A1 | 9/2019 | Kim et al. | |
| 2020/0019344 A1* | 1/2020 | Lim | H01L 25/0655 |
| 2020/0105348 A1 | 4/2020 | Kim et al. | |
| 2020/0227398 A1 | 7/2020 | Oh et al. | |

* cited by examiner

FIG. 6

| CLE | ALE | /CE | /WE | /RE | MODE | |
|---|---|---|---|---|---|---|
| H | L | L | ⤹ | H | READ MODE | COMMAND INPUT |
| L | H | L | ⤹ | H | | ADDRESS INPUT |
| H | L | L | ⤹ | H | WRITE MODE | COMMAND INPUT |
| L | H | L | ⤹ | H | | ADDRESS INPUT |

NONVOLATILE MEMORY DEVICES INCLUDING MEMORY PLANES AND MEMORY SYSTEMS INCLUDING THE SAME

CROSS-REFERENCE TO RELATED APPLICATIONS

This U.S. non-provisional application is a continuation-in-part application of U.S. patent application Ser. No. 16/432,959 filed on Jun. 6, 2019, which claims priority under 35 U.S.C. § 119 to Korean Patent Application No. 10-2018-0150016, filed on Nov. 28, 2018, in the Korean Intellectual Property Office (KIPO), the disclosure of each of which is incorporated by reference herein in its entirety.

TECHNICAL FIELD

Aspects of the present disclosure relate generally to semiconductor integrated circuits, and more particularly to nonvolatile memory devices including memory planes and memory systems including such nonvolatile memory devices.

BACKGROUND

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and may lose the stored data when power is turned off, removed, or disabled. Nonvolatile memory devices, such as flash memory devices, may maintain stored data even when power is turned off, removed, or disabled. Volatile memory devices are widely used as main memories of various apparatuses, and nonvolatile memory devices are widely used for storing program codes and/or data in various electronic devices, such as computers, mobile devices, or the like.

Recently, nonvolatile memory devices having three-dimensional structures such as vertical NAND memory devices have been developed to increase a degree of integration and/or memory capacity of nonvolatile memory devices. Along with increases in the integration degree and memory capacity, increases to data transfer speeds of nonvolatile memory devices are also desired.

SUMMARY

Some examples of embodiments may provide a nonvolatile memory device appropriate for a multi-plane structure.

Some examples of embodiments may provide a memory system including a nonvolatile memory device appropriate for a multi-plane structure.

According to some examples of embodiments, a nonvolatile memory device includes a plurality of memory planes and a plurality of plane-dedicated pad sets. The plurality of memory planes includes a plurality of page buffer circuits and a plurality of memory cell arrays including nonvolatile memory cells. Each of the plurality of page buffer circuits is connected through bitlines to ones of the nonvolatile memory cells included in each of the plurality of memory cell arrays. A plurality of plane-dedicated pad sets are connected to the plurality of page buffer circuits through a plurality of data paths such that each of the plurality plane-dedicated pad sets is connected to a respective page buffer circuit of the plurality of page buffer circuits.

According to some examples of embodiments, a memory system includes a nonvolatile memory device and a memory controller configured to control operations of the nonvolatile memory device. The nonvolatile memory device includes a plurality of memory planes comprising a plurality of page buffer circuits and a plurality of memory cell arrays including nonvolatile memory cells, where each of the plurality of page buffer circuits is connected through bitlines to the nonvolatile memory cells included in each of the plurality of memory cell arrays. A plurality of plane-dedicated pad sets are respectively connected to the plurality of page buffer circuits through a plurality of data paths such that each of the plurality plane-dedicated pad sets is dedicatedly connected to the respective page buffer circuit of the plurality of page buffer circuits.

According to some examples of embodiments, a vertical NAND flash memory device includes a plurality of memory planes comprising a plurality of page buffer circuits and a plurality of memory cell arrays including flash memory cells stacked in a vertical direction to form cell strings, where each of the plurality of page buffer circuits is connected through bitlines to the cell strings included in each of the plurality of memory cell arrays. A plurality of plane-dedicated pad sets is respectively connected to the plurality of page buffer circuits through a plurality of data paths such that each of the plurality plane-dedicated pad sets is dedicatedly connected to the respective page buffer circuit of the plurality of page buffer circuits.

The nonvolatile memory device and the memory system according to some examples of embodiments may increase a bandwidth of a data transfer by reducing a data transfer delay and supporting parallel data transfer through the plurality of plane-dedicated pad sets respectively assigned to the plurality of memory planes.

The nonvolatile memory device and the memory system according to some examples of embodiments may decrease power consumption using the plurality of plane-dedicated pad sets respectively assigned to the plurality of memory planes by removing data multiplexing and/or signal routing.

BRIEF DESCRIPTION OF THE DRAWINGS

Examples of embodiments of the present disclosure will be more clearly understood from the following detailed description taken in conjunction with the accompanying drawings.

FIG. 6 is a diagram illustrating example control signals of a nonvolatile memory device according to some examples of embodiments.

DETAILED DESCRIPTION

Figure 1:
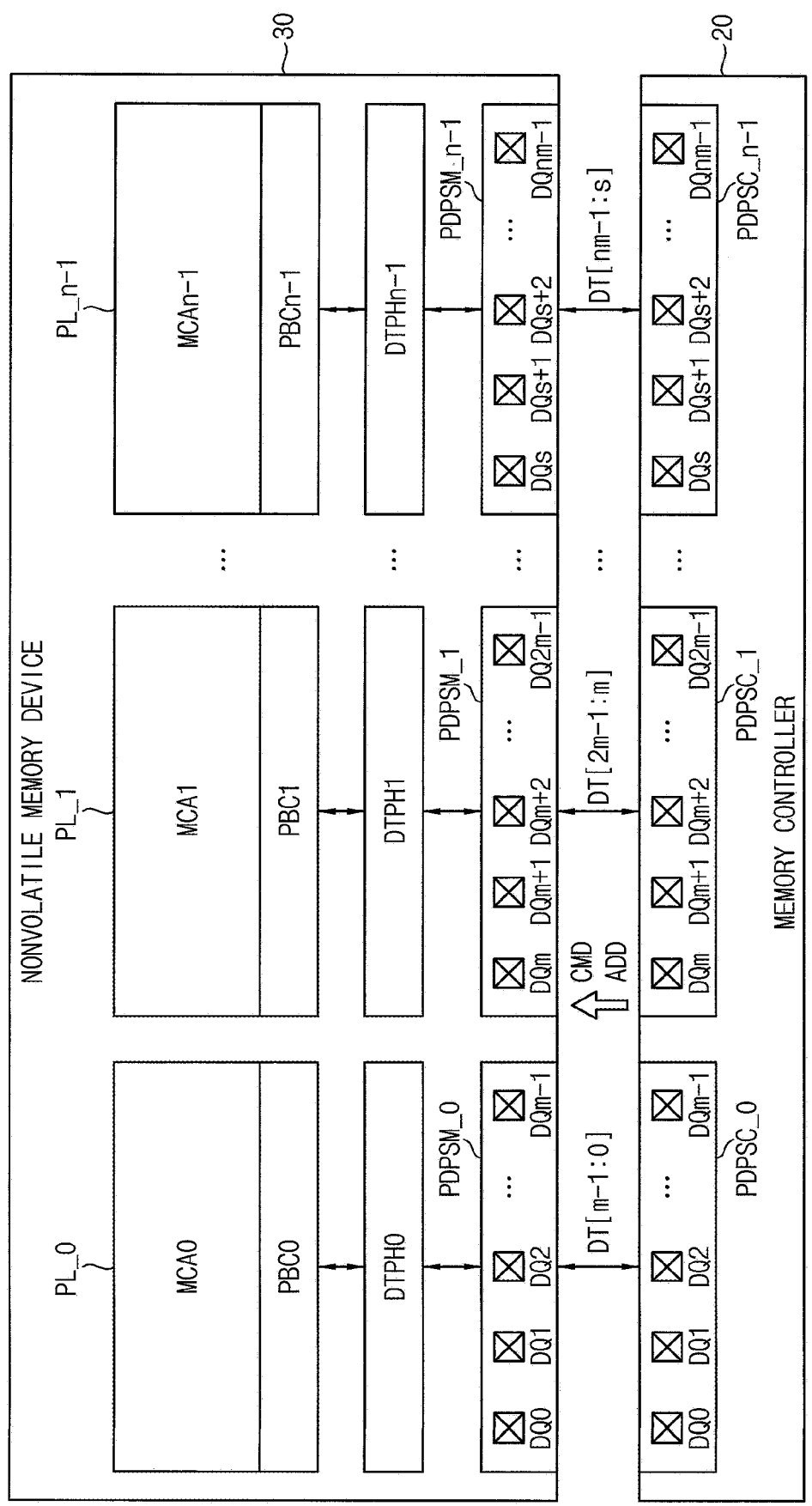
FIG. 1 is a block diagram illustrating a memory system including a nonvolatile memory device according to some examples of embodiments.

Various examples of embodiments will be described more fully hereinafter with reference to the accompanying drawings, in which only some examples of embodiments are shown. In the drawings, like numerals refer to like elements throughout. The repeated descriptions may be omitted.

FIG. 1 is a block diagram illustrating a memory system including a nonvolatile memory device according to some examples of embodiments.

Referring to FIG. 1, a memory system 10 includes a memory controller 20 and at least one memory device 30.

The at least one memory device 30 may be a nonvolatile memory device, and may be referred to as such herein. The memory system 10 may include data storage media based on flash memory such as a memory card, a universal serial bus (USB) memory, and/or a solid state drive (SSD).

The nonvolatile memory device 30 may be configured to perform read operations, erase operations, program operations, and/or write operations under control of the memory controller 20. The nonvolatile memory device 30 may receive a command CMD and an address ADD from the memory controller 20, and may exchange data for the read operation and the program operation with the memory controller 20. In some examples of embodiments, the nonvolatile memory device 30 may receive control signals and power from the memory controller 20.

The nonvolatile memory device 30 may include a plurality of memory planes PL_0~PL_n−1, a plurality of data paths DTPH0~DTPHn−1, and a plurality of plane-dedicated pad sets PDPSM_0~PDPSM_n−1.

Each of the plurality of memory planes PL_0~PL_n−1 may include a respective one of a plurality of memory cell arrays MCA0~MCAn−1, each including nonvolatile memory cells. Each of the plurality of memory planes PL_0~PL_n−1 may also include a respective one of a plurality of page buffer circuits PBC0~PBCn−1. Each of the page buffer circuits PBC0~PBCn−1 may be connected to the nonvolatile memory cells included in each of the memory cell arrays MCA0~MCAn−1 through bitlines. In other words, a first memory plane PL_0 may include a first memory cell array MCA0 and a first page buffer circuit PBC0, a second memory plane PL_1 may include a second memory cell array MCA1 and a second page buffer circuit PBC1, and in this way an n-th memory plane PL_n−1 may include an n-th memory cell array MCAn−1 and an n-th page buffer circuit PBCn−1. In some examples of embodiments, each of the page buffer circuits PBC0~PBCn−1 may correspond to a page size or a number of bitlines of each memory plane.

The plurality of plane-dedicated pad sets PDPSM_0~PDPSM_n−1 may be connected to the plurality of page buffer circuits PBC0~PBCn−1 through a plurality of data paths DTPH0~DTPHn−1 respectively one by one such that each of the plane-dedicated pad sets PDPSM_0~PDPSM_n−1 is dedicatedly connected to each of the page buffer circuits PBC0~PBCn−1. For example, a first data path of the plurality of data paths (e.g., DTPH0) may independently connect a first page buffer circuit (e.g., PBC0) to a first plane-dedicated pad set (e.g., PDPSM_0). Each of data paths DTPH0~DTPHn−1 may include a data input-output circuit, which will be described below with reference to FIG. 2.

Each of the plane-dedicated pad sets PDPSM_0~PDPSM_n−1 may include a plurality of data pads. For example, the first plane-dedicated pad set PDPSM_0 may include m data pads DQ0~DQm−1 to transfer data signals DT[m−1:0], the second plane-dedicated pad set PDPSM_1 may include m data pads DQm~DQ2m−1 to transfer data signals DT[2m−1:m], and in this way the n-th plane-dedicated pad set PDPSM_n−1 may include m data pads DQs~DQnm−1 to transfer data signals DT[nm−1:s], where s is (n−1)*m. In other words, each of the n plane-dedicated pad sets PDPSM_0~PDPSM_n−1 may include m data pads, respectively, and the total number of the data pads DQ0~DQnm−1 may be n*m. In some examples of embodiments, a number of the data pads included in each of the plane-dedicated pad sets may be eight, which may correspond to the eight bits in a byte. In other words, in some examples of embodiments m may be equal to eight.

The memory controller 20 may include a plurality of host pad sets PDPSC_0~PDPSC_n−1 that are connected to the plurality of plane-dedicated pad sets PDPSM_0~PDPSM_n−1 respectively one by one such that each of the host pad sets PDPSC_0~PDPSCn−1 is dedicatedly connected to each of the plane-dedicated pad sets PDPSM_0~PDPSM_n−1. The internal configuration of the memory controller 20 may be determined variously as well known to those skilled in the art.

Each of the plurality of host pad sets PDPSC_0~PDPSC_n−1 may include a plurality of host data pads, which are connected to the plurality of data pads included in each of the plurality of plane-dedicated pad sets PDPSM_0~PDPSM_n−1 such that each of the plurality of host data pads is dedicatedly connected to each of the plurality of data pads. In other words, each of the first host pad set PDPSC_0 and the first plane-dedicated pad set PDPSM_0 may include the m data pads DQ0~DQm−1, each of the second host pad set PDPSC_1 and the second plane-dedicated pad set PDPSM_1 may include the m data pads DQm~DQ2m−1, and in this way each of the n-th host pad set PDPSC_n−1 and the n-th plane-dedicated pad set PDPSM_n−1 may include the m data pads DQs~DQnm−1.

As will be described below, parallel and/or independent multi-plane operations with respect to the plurality of memory planes PL_0~PL_n−1 may be performed using the plurality of plane-dedicated pad sets PDPSM_0~PDPSM_n−1 that are assigned or mapped to the plurality of memory planes PL_0~PL_n−1 respectively, that is, in a one-to-one relationship.

The nonvolatile memory device 30 and the memory system 10 according to some examples of embodiments may increase a bandwidth of a data transfer by reducing a data transfer delay and supporting a parallel data transfer through the plurality of plane-dedicated pad sets PDPSM_0~PDPSM_n−1 respectively assigned to the plurality of memory planes PL_0~PL_n−1. In addition, the nonvolatile memory device 30 and the memory system 10 according to some examples of embodiments may decrease power consumption using the plurality of plane-dedicated pad sets PDPSM_0~PDPSM_n−1 respectively assigned to the plurality of memory planes PL_0~PL_n−1 by removing data multiplexing and/or signal routing as will be described with reference to FIGS. 11, 12 and 13.

Figure 2:
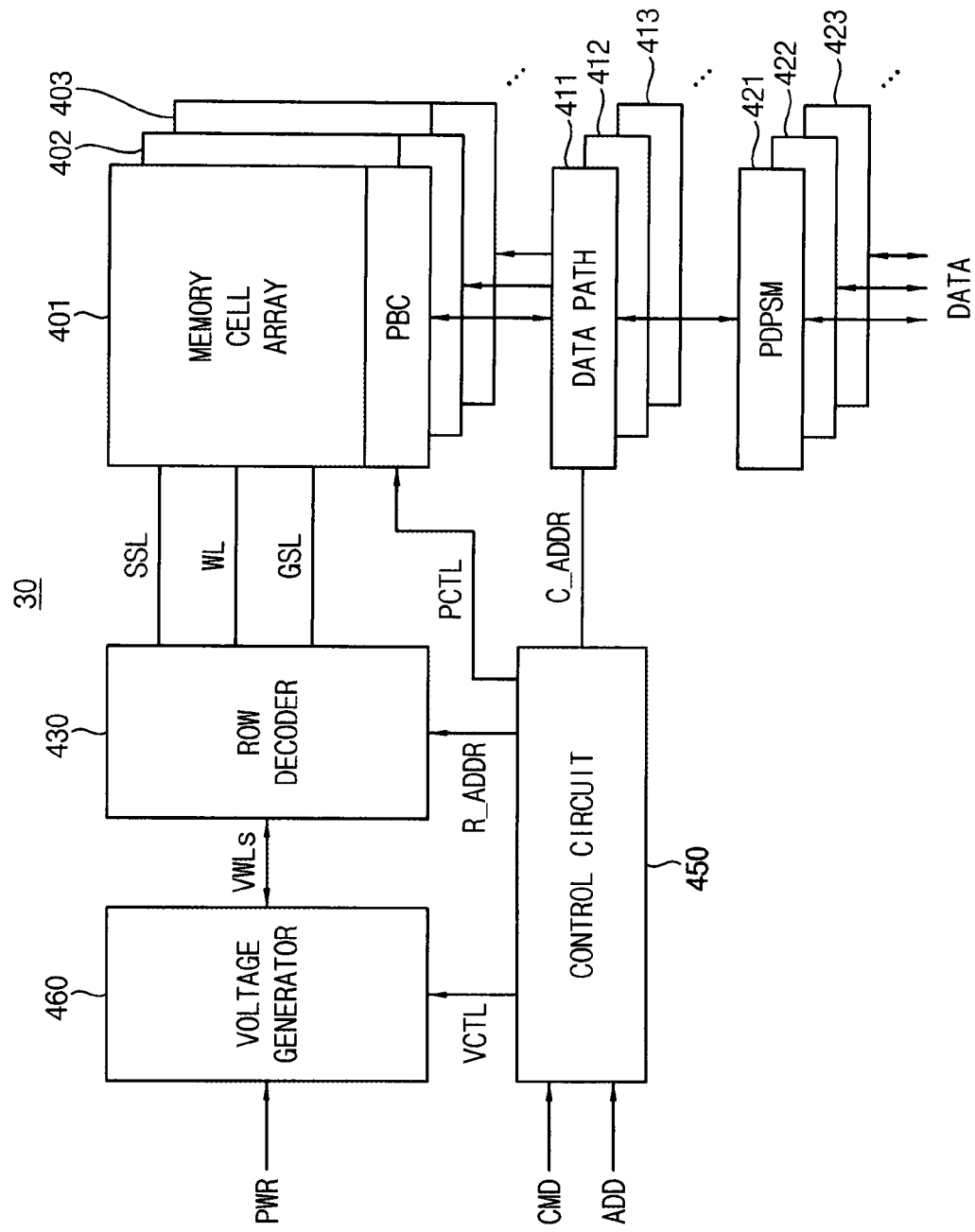
FIG. 2 is a block diagram illustrating a nonvolatile memory device according to some examples of embodiments.

FIG. 2 is a block diagram illustrating a nonvolatile memory device according to some examples of embodiments.

Referring to FIG. 2, a nonvolatile memory device 30 may include a plurality of memory planes 401, 402 and 403, each including a respective memory cell array and a page buffer circuit PBC. The nonvolatile memory device 30 may also include a row decoder 430, a plurality of data paths 411, 412 and 413, a plurality of plane-dedicated pad sets PDPSM 421, 422 and 423, a control circuit 450, and a voltage generator 460.

Each memory cell array may be coupled to the row decoder 430 through a plurality of string selection lines SSL, a plurality of word lines WL, and a plurality of ground selection lines GSL. In addition, each memory cell array may be coupled to the respective page buffer circuit PBC through a plurality of bitlines (not shown). Each memory cell array may include a plurality of memory cells coupled to the plurality of word lines WL and the plurality of bitlines. In some examples of embodiments, the memory cell array may be a three-dimensional memory cell array, which may be formed on a substrate in a three-dimensional structure (or a vertical structure). In some examples of embodiments, each memory cell array may include a plurality of NAND strings or a plurality of cell strings that are vertically oriented such that at least one memory cell is located over another memory cell.

The control circuit 450 may receive a command (signal) CMD and an address (signal) ADD from the memory controller 20 in FIG. 1 and control erasing, programming, writing, and/or reading operations of the nonvolatile memory device 30 based on the command signal CMD and the address signal ADD. An erasure operation may comprise performing a sequence of erase loops, and a program operation may include performing a sequence of program loops. Each program loop may include a program period and a program verification period. Each erase loop may include an erase period and an erase verification period. The read operation may include a normal read operation and data recover read operation.

Based on the command signal CMD, the control circuit 450 may generate the control signals VCTL, which are used for controlling the voltage generator 460, and may generate the page buffer control signal PCTL for controlling the page buffer circuit PBC. Based on the address signal ADD, the control circuit 450 may generate the row address R_ADDR and the column address C_ADDR. The control circuit 450 may provide the row address R_ADDR to the row decoder 430 and provide the column address C_ADDR to the data paths 411, 412 and 413. The row decoder 430 may be coupled to the memory cell array through the plurality of string selection lines SSL, the plurality of word lines WL, and the plurality of ground selection lines GSL.

During the program operation or the read operation, the row decoder 430 may determine that one of the word lines WL is a selected word line and determine that the rest of the word lines WL except for the selected word line are unselected word lines based on the row address R_ADDR.

In addition, during the program operation or the read operation, the row decoder 430 may determine that one of the string selection lines SSL is a selected string selection line and determine that the rest of the string selection lines SSL except for the selected string selection line are unselected string selection lines based on the row address R_ADDR.

The voltage generator 460 may generate word line voltages VWLs, which may be required for the operation of the memory cell array of the nonvolatile memory device 30, based on the control signals VCTL. The voltage generator 460 may receive the power PWR from the memory controller 20. The word line voltages VWLs may be applied to the word lines WL through the row decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

Each page buffer circuit PBC may be coupled to the memory cell array through the bitlines. The page buffer circuit PBC may include a plurality of page buffers. In some examples of embodiments, each page buffer may be connected to only one bit line. In other examples of embodiments, each page buffer may be connected to two or more bitlines. The page buffer circuit PBC may temporarily store data to be programmed in a selected page or data read out from the selected page of the memory cell array.

Each of the data paths 411, 412 and 413 may include a data input-output circuit. Each data input-output circuit may be coupled to the corresponding page buffer circuit PBC through data lines. During the program operation, the data input-output circuit may receive program data DATA received from the memory controller 20 and provide the program data DATA to the page buffer circuit PBC based on the column address C_ADDR received from the control circuit 450. During the read operation, the data input-output circuit may provide read data DATA, having been read from the memory cell array and stored in the page buffer circuit PBC, to the memory controller 20 based on the column address C_ADDR received from the control circuit 450.

In addition, the page buffer circuit PBC and the data input-output circuit included in each of the data paths 411, 412 and 413 may read data from a first area of the memory cell array and may write this read data to a second area of the memory cell array (e.g., without transmitting the data to a source external to the nonvolatile memory device 30, such as to the memory controller 20). That is, the page buffer circuit and the data input-output circuit may perform a copy-back operation.

Figure 3A:
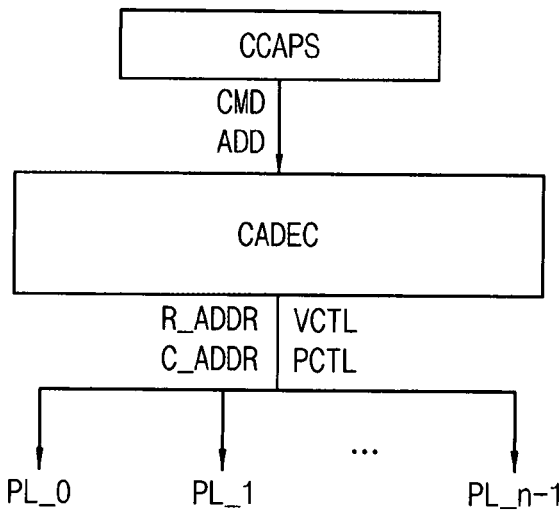
FIGS. 3A and 3B are diagrams illustrating some examples of embodiments of a command-address decoder included in a nonvolatile memory device.
Figure 3B:
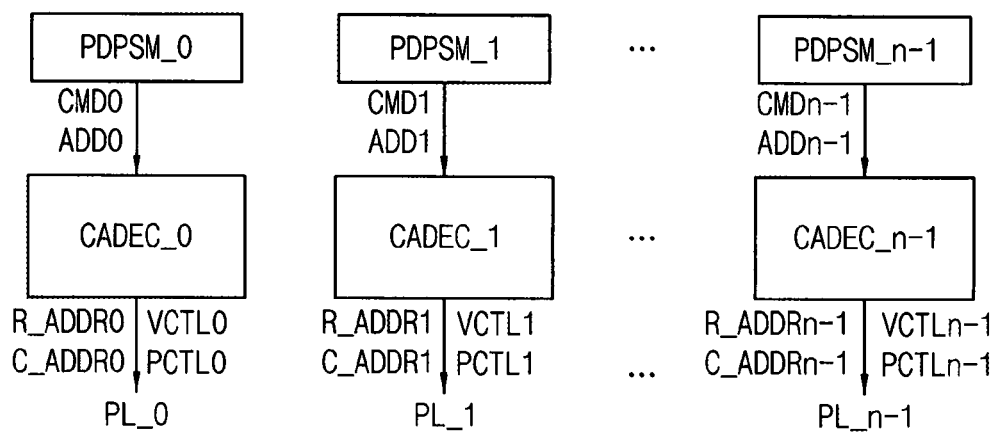

FIGS. 3A and 3B are diagrams illustrating examples of embodiments of a command-address decoder included in a nonvolatile memory device.

Referring to FIG. 3A, a nonvolatile memory device 455 may include a command-address pad set CCAPS and a common command-address decoder CADEC. The common command-address decoder CADEC may be included in the control circuit 450 in FIG. 2.

The command-address pad set CCAPS may include pads to receive commands CMD and addresses ADD provided from the memory controller 20. Based on the commands CMD and addresses ADD received through the command-address pad set CCAPS, the common command-address decoder CADEC may generate control signals VCTL and PCTL, a row address R_ADDR and a column address C_ADDR that are commonly applied to the plurality of memory planes PL_0~PL_n−1. Using the command-address pad set CCAPS and the common command-address decoder CADEC, the same operations may be performed simultaneously or in parallel with respect to the plurality of memory planes PL_0~PL_n−1.

In some examples of embodiments, as illustrated in FIG. 3B, a nonvolatile memory device 457 may receive commands CMD0~CMDn−1 and addresses ADD0~ADDn−1 respectively corresponding to the plurality of memory planes PL_0~PL_n−1 through the plurality of data pads included in each of the plurality of plane-dedicated pad sets PDPSM_0~PDPSM_n−1 independently per memory plane. For example, the nonvolatile memory device 457 may include a plurality of plane-dedicated command-address decoders CADEC_0~CADEC_n−1 as illustrated in FIG. 3B. Based on the commands CMD0~CMDn−1 and addresses ADD0~ADDn−1 received through the plurality of data pads included in each of the plurality of plane-dedicated pad sets PDPSM_0~PDPSM_n−1, the plane-dedicated command-address decoders CADEC_0~CADEC_n−1 may generate control signals VCTL0~VCTLn−1 and PCTL0~PCTLn−1, row addresses R_ADDR0~R_ADDRn−1 and column addresses C_ADDR0~C ADDRn−1 that are independently applied to each of the plurality of memory planes PL_0~PL_n−1. Using the plurality of plane-dedicated command-address decoders CADEC_0~CADEC_n−1, the same operations or the different operations may be performed simultaneously or in parallel with respect to the plurality of memory planes PL_0~PL_n−1.

Hereinafter, a vertical NAND flash memory device according to some examples of embodiments will be described with reference to FIGS. 4, 5A and 5B. A first direction D1 indicates a direction perpendicular to an upper surface of a semiconductor substrate, and a second direction D2 and a third direction D3 indicate two directions parallel to the upper surface of the semiconductor substrate. For example, the second direction D2 and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 4:
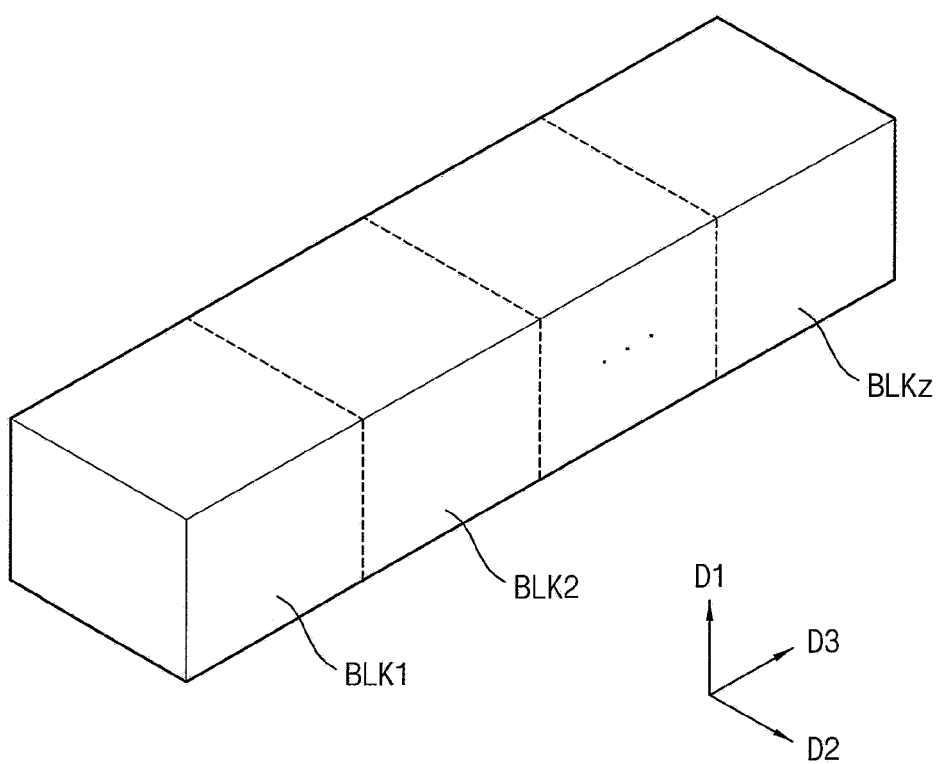
FIG. 4 is a block diagram illustrating a memory cell array included in the nonvolatile memory device of FIG. 2.
Figure 5A:
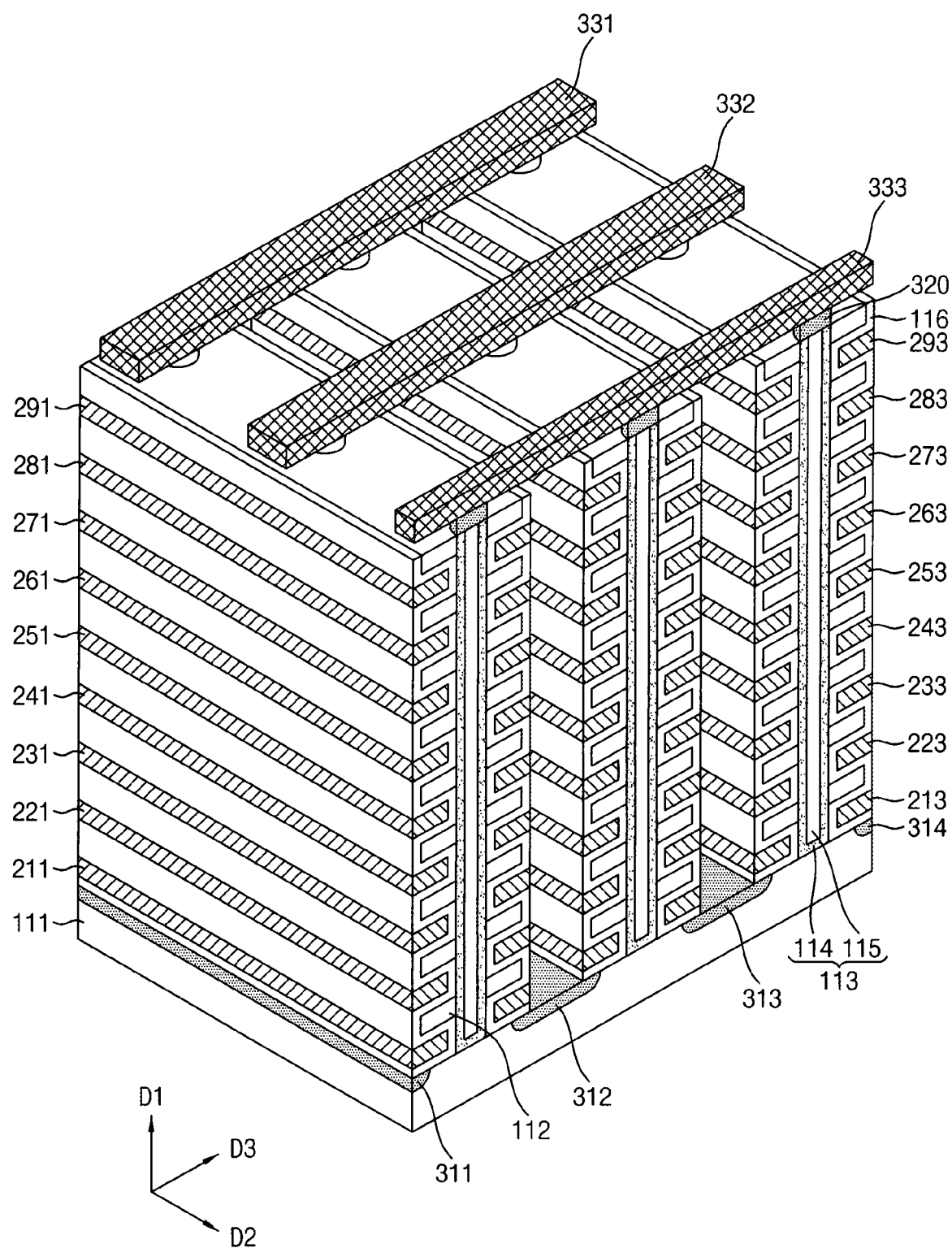
FIG. 5A is a perspective view illustrating an example of an embodiment of a memory block included in the memory cell array of FIG. 4.

FIG. 4 is a block diagram illustrating a memory cell array included in the nonvolatile memory device of FIG. 2, and FIG. 5A is a perspective view illustrating an example of an embodiment of a memory block included in the memory cell array of FIG. 4.

Referring to FIG. 4, a memory cell array MCA may include a plurality of memory blocks BLK1 to BLKz. In some examples of embodiments, the memory blocks BLK1 to BLKz may be selected by the row decoder 430 in FIG. 2. For example, the row decoder 430 may select a particular memory block BLK corresponding to a block address among the memory blocks BLK1 to BLKz.

Referring to FIG. 5A, a memory block BLKi may include NAND strings or cell strings which are formed on a substrate in a three-dimensional structure (or a vertical structure). The memory block BLKi may include structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In some examples of embodiments, the substrate 111 has a p-type well (or a p-type pocket well). However, the conductive type of the substrate 111 is not limited to the p-type.

A plurality of doping regions 311 to 314 extending in the second direction D2 are provided in/on the substrate 111. For example, the plurality of doping regions 311 to 314 may have a second type (e.g., a second conductive type) different from the first type of the substrate 111. In some examples of embodiments, the first to fourth doping regions 311 to 314 may have an n-type. However, the conductive type of the first to fourth doping regions 311 to 314 is not limited to the n-type.

A plurality of insulation materials 112 extending in the second direction D2 are sequentially provided along the first direction D1 on a region of the substrate 111 between the first and second doping regions 311 and 312. For example, the plurality of insulation materials 112 extend in the second direction D2, being spaced apart from each other by a specific distance in the first direction D1. For example, the insulation materials 112 may include an insulation material such as an oxide layer.

A plurality of pillars 113 penetrating the insulation materials in the first direction D1 are sequentially disposed along the second direction D2 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In some examples of embodiments, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap.

An insulation layer 116 may be provided along the exposed surfaces of the insulation materials 112, the pillars 113, and the substrate 111, on a region between the first and second doping regions 311 and 312.

A plurality of first conductive materials 211 to 291 may be provided on surfaces of the insulation layer 116, in a region between the first and second doping regions 311 and 312. For example, the first conductive material 211 may extend in the second direction D2 and may be provided between the substrate 111 and the insulation material 112 that is adjacent to the substrate 111. In more detail, the first conductive material 211 extending in the second direction D2 may be provided between the substrate 111 and the insulation layer 116 at the bottom of the insulation material 112 adjacent to the substrate 111. In some examples of embodiments, the first conductive material 211 extending in the second direction D2 may be provided between an insulation layer 116 on the top of the substrate 111 and an insulation layer 116 at the bottom of the insulation material 112 adjacent to the substrate 111.

A first conductive material extending in the second direction D2 may be provided between the insulation layer 116 on top of a specific insulation material among the insulation materials 112 and the insulation layer 116 on the bottom of the insulation material among the insulation materials 112 that is adjacent to and above the specific insulation material among the insulation materials 112. For example, a plurality of first conductive materials 221 to 281 extending in the second direction D2 may be provided between the insulation materials 112 and it may be understood that the insulation layer 116 is provided between the insulation materials 112 and each of the first conductive materials 221 to 281. The first conductive materials 211 to 291 may be formed of a conductive metal. In some examples, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending in the second direction D2, a plurality of pillars 113 disposed sequentially along the second direction D2 and penetrating the plurality of insulation materials 112 in the first direction D1, an insulation layer 116 provided on the exposed surfaces of the plurality of insulation materials 112 and the plurality of pillars 113, and a plurality of conductive materials 213 to 293 extending in the second direction D2.

Drains 320 may be provided on the plurality of pillars 113, respectively. On the drains 320, the second conductive materials 331 to 333 extending in the third direction D3 are provided. The second conductive materials 331 to 333 may be spaced apart from each other in the second direction D2, and in some examples of embodiments may be spaced apart by a specific distance. The second conductive materials 331 to 333 may be respectively connected to the drains 320 in a corresponding region. The drains 320 and the second conductive materials 331 to 333 extending in the third direction D3 may be connected through each contact plug. The second conductive materials 331 to 333 may include metal materials. The second conductive materials 331 to 333 may include conductive materials such as a polysilicon.

The layers in which the first conductive materials are formed may correspond to gate layers and the first conductive materials may form gate lines such as a string selection line SSL, a word line WL, a ground selection line GSL, etc. The second conductive materials may form a bitline BL.

Figure 5B:
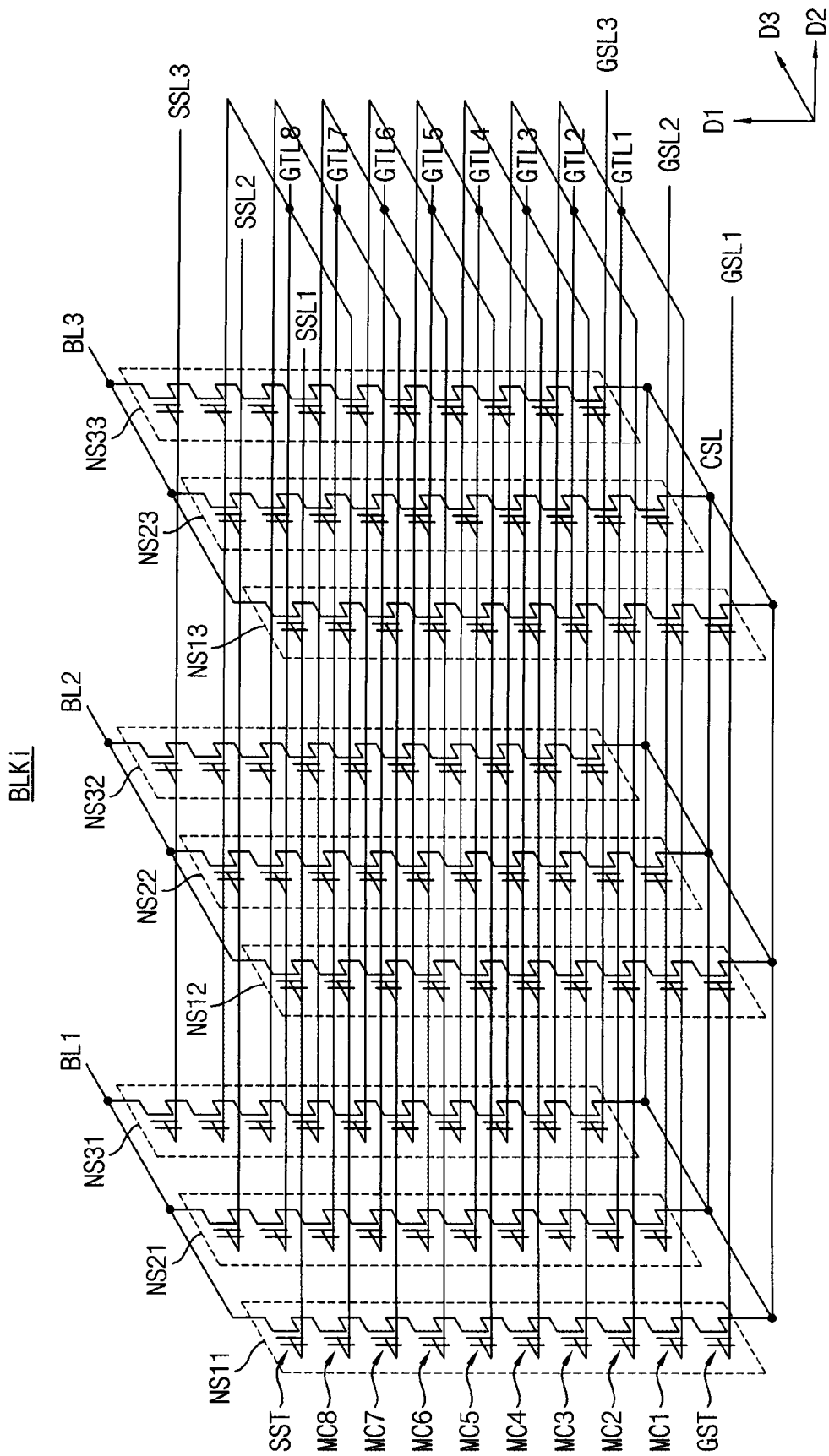
FIG. 5B is a circuit diagram illustrating an equivalent circuit of the memory block described with reference to FIG. 5A.

FIG. 5B is a circuit diagram illustrating an equivalent circuit of the memory block described with reference to FIG. 5A.

The memory block BLKi of FIG. 5B may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 5B, the memory block BLKi may include NAND strings NS11 to NS33 coupled between bitlines BL1, BL2 and BL3 and a common source line CSL. Each of the NAND strings NS11 to NS33 may include a string selection transistor SST, a plurality of memory cells MC1 to MC8, and a ground selection transistor GST. In FIG. 5B, each of the NAND strings NS11 to NS33 is illustrated to include eight memory cells MC1 to MC8. However, examples of embodiments are not limited thereto. In some examples of embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. Each ground selection transistor GST may be connected to a corresponding ground selection line (one of GSL1 to GSL3). Each string selection transistor SST may be connected to a corresponding bitline (e.g., one of BL1, BL2 and BL3), and each ground selection transistor GST may be connected to the common source line CSL.

Word lines having the same height may be commonly connected, and the ground selection lines GSL1 to GSL3 and the string selection lines SSL1 to SSL3 may be separated. In FIG. 5B, the memory block BLKi is illustrated to be coupled to eight gate lines GTL1 to GTL8 and three bitlines BL1 to BL3. However, examples of embodiments are not limited thereto. Each memory block in the memory cell array may be coupled to any number of word lines and any number of bitlines.

FIG. 6 is a diagram illustrating example control signals of a nonvolatile memory device according to some examples of embodiments, and FIGS. 7 through 10 are timing diagrams illustrating example operation modes of a nonvolatile memory device according to some examples of embodiments.

Figure 7:
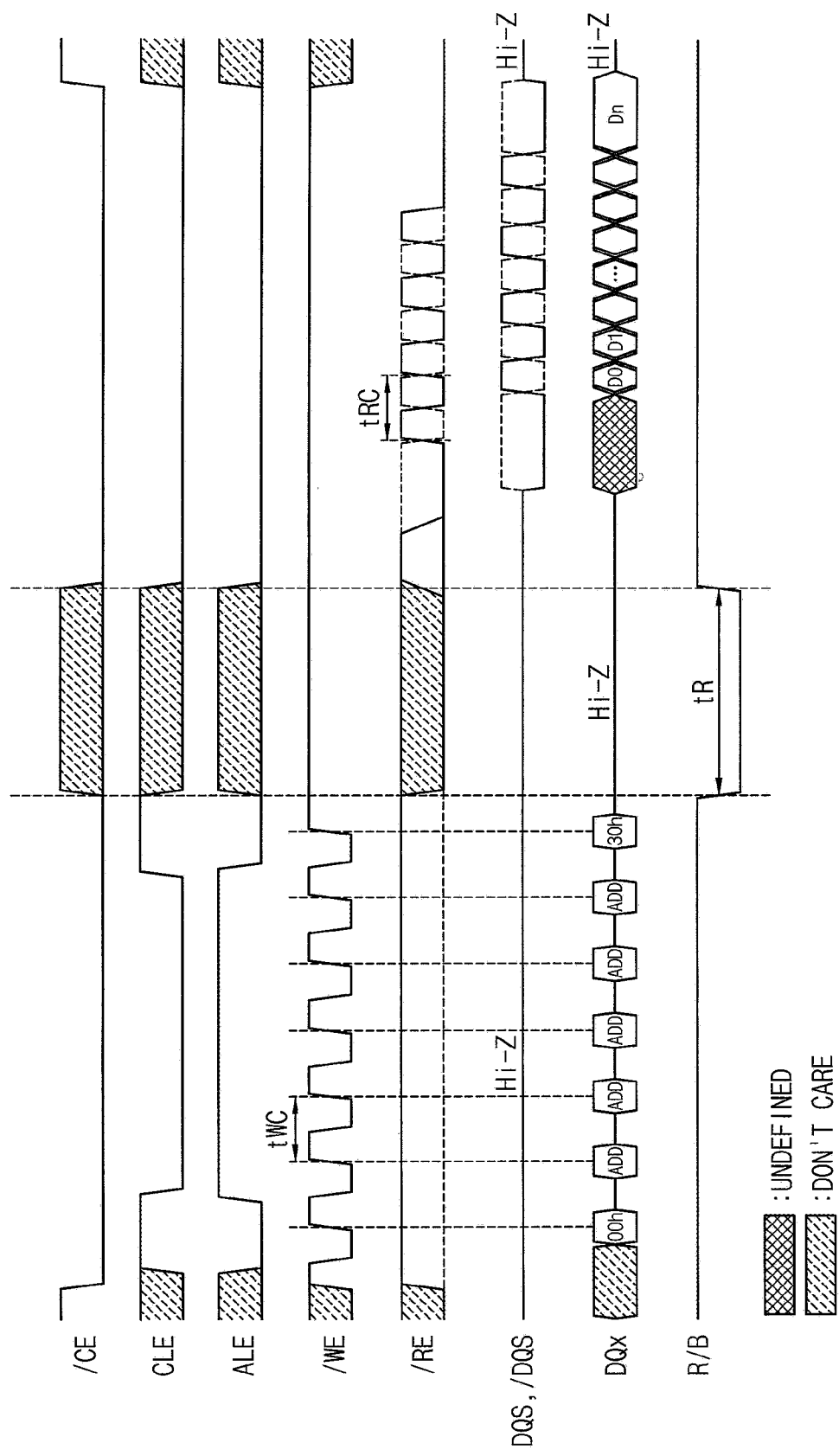
FIGS. 7 through 10 are timing diagrams illustrating example operation modes of a nonvolatile memory device according to some examples of embodiments.
Figure 8:
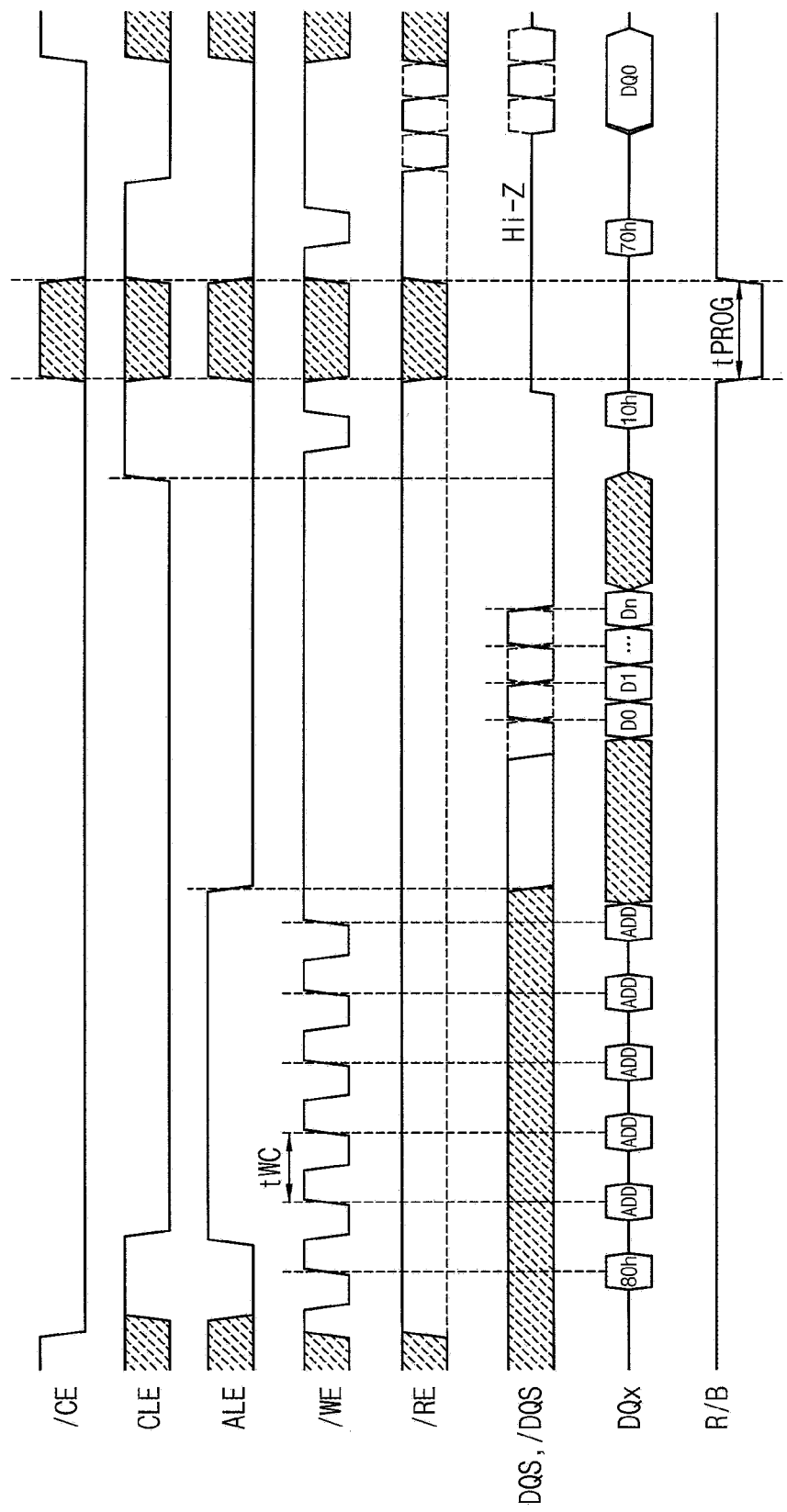
Figure 9:
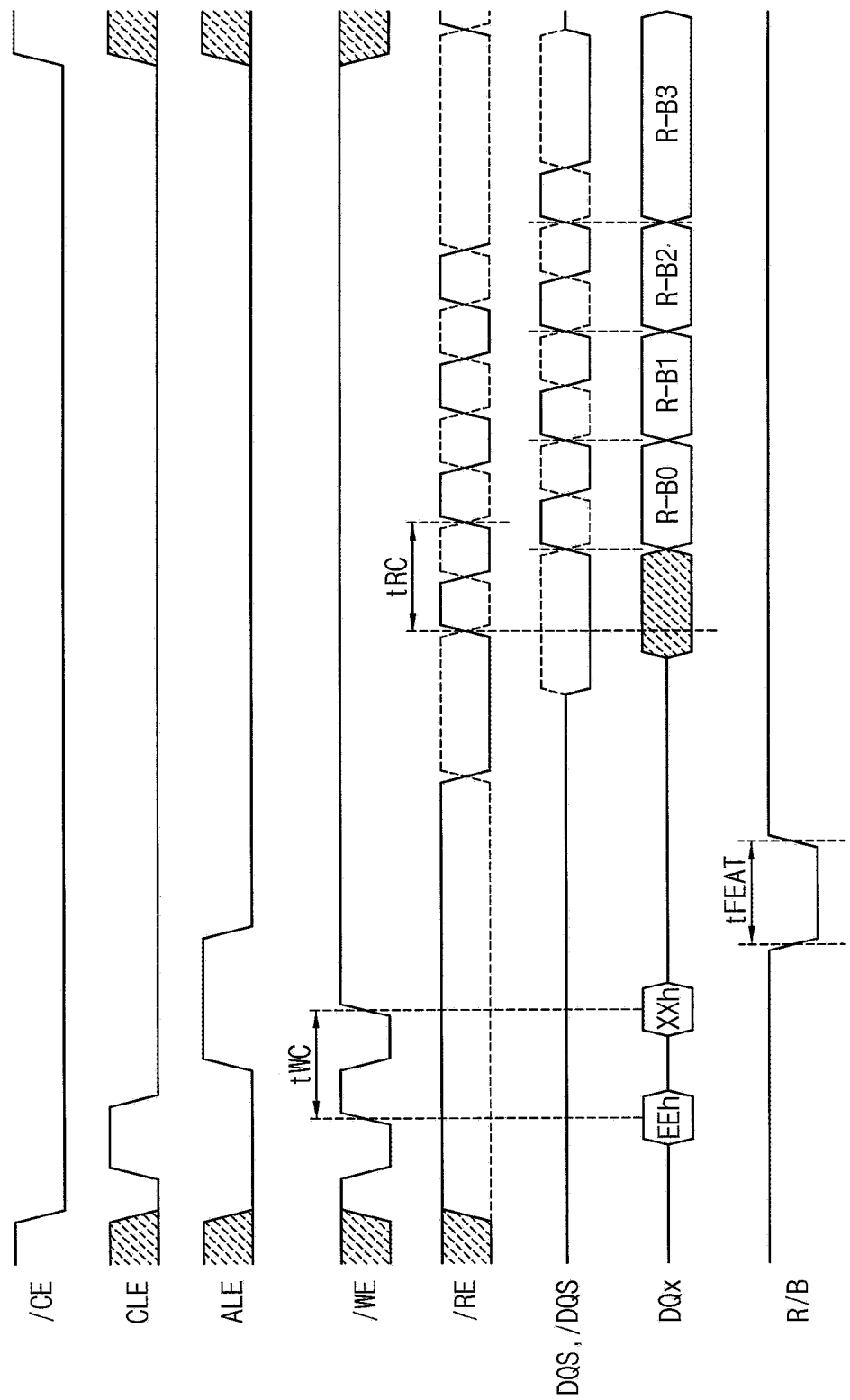
Figure 10:
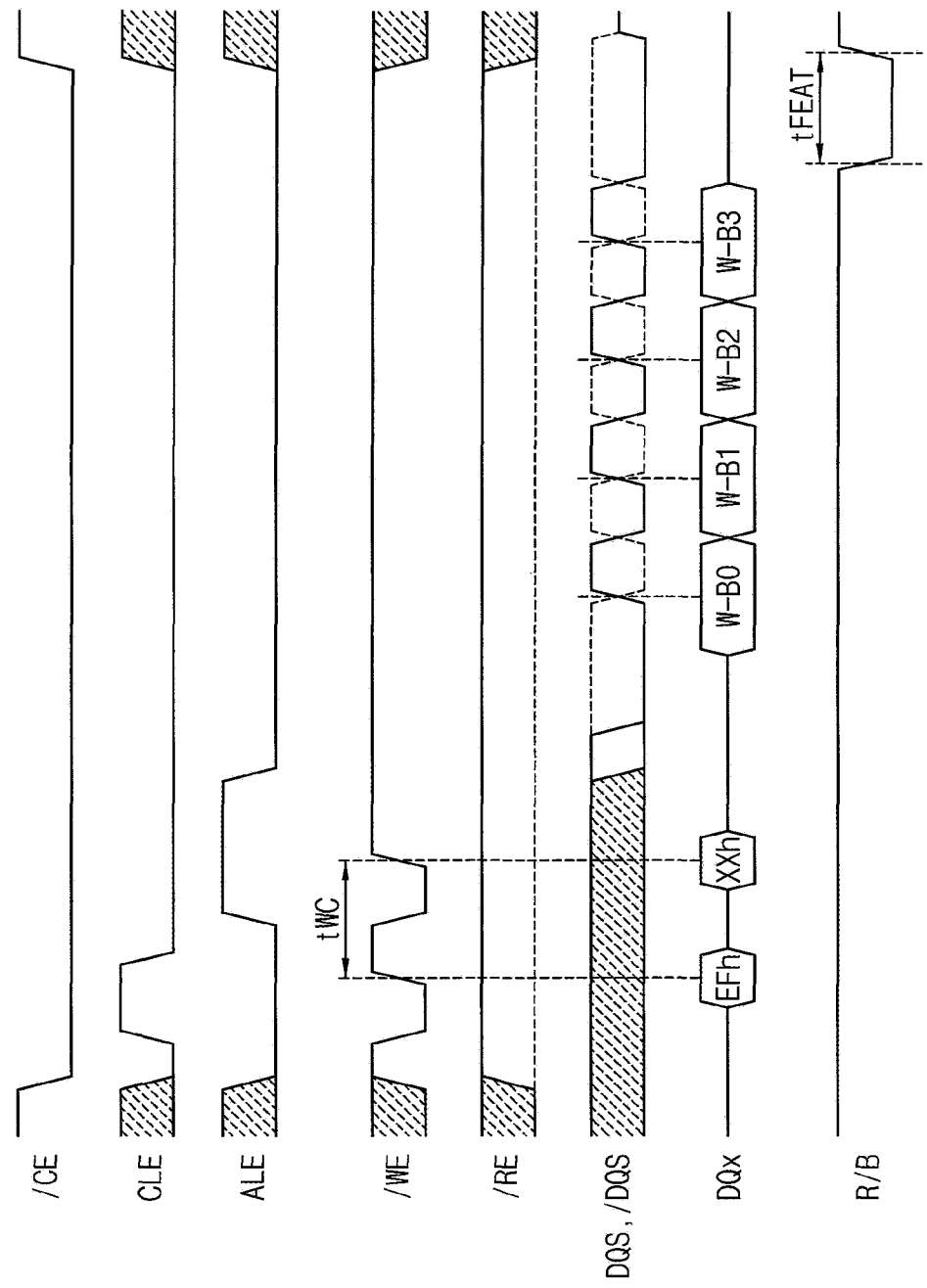

FIG. 7 illustrates an example read operation, FIG. 8 illustrates an example write operation, FIG. 9 illustrates an example set feature operation and FIG. 10 illustrates an example get feature operation.

FIGS. 6 through 10 illustrate logic levels and waveforms of a chip enable signal/CE, a command latch enable signal CLE, an address latch enable signal ALE, a write enable signal /WE, a read enable signal/RE, data strobe signals DQS and/DQS, a data signal DQx and a ready/busy signal R/B. In FIGS. 6 through 10, H indicates a logic high level, L indicates a logic low level, Hi-Z indicates a high impedance state, tWC indicates a write cycle time, tRC indicates a read cycle time, tR indicates a data transfer time from the memory cell array to the page buffer circuit, tPROG indicates a program time, tFEAT indicates a busy time of the set feature operation or the get feature operation, 00h, 30h, 80h, 10h, EEh and EFh indicate commands of the respective operations, and XXh indicates a register address related with feature information or feature data. D0~Dn indicate the read data or the write data, R-B0~R-B3 indicate read feature data, and R-W0~R-W3 indicate write feature data.

Referring to FIGS. 6 through 10, the nonvolatile memory device according to some examples of embodiments may output the read data through the plurality of data pads included in each of the plurality of plane-dedicated pad sets in synchronization with transitions of the read enable signal/RE.

In addition, the nonvolatile memory device may latch the commands and the addresses received through the plurality of data pads included in each of the plurality of plane-dedicated pad sets in synchronization with transitions of the write enable signal/WE. Also the nonvolatile memory device may receive the write data or output the read data through the plurality of data pads included in each of the plurality of plane-dedicated pad sets while the write enable signal/WE is activated.

In addition, the nonvolatile memory device may selectively receive the commands or the addresses received through the plurality of data pads included in each of the plurality of plane-dedicated pad sets, based on the command latch enable signal CLE and the address latch enable signal ALE.

Figure 11:
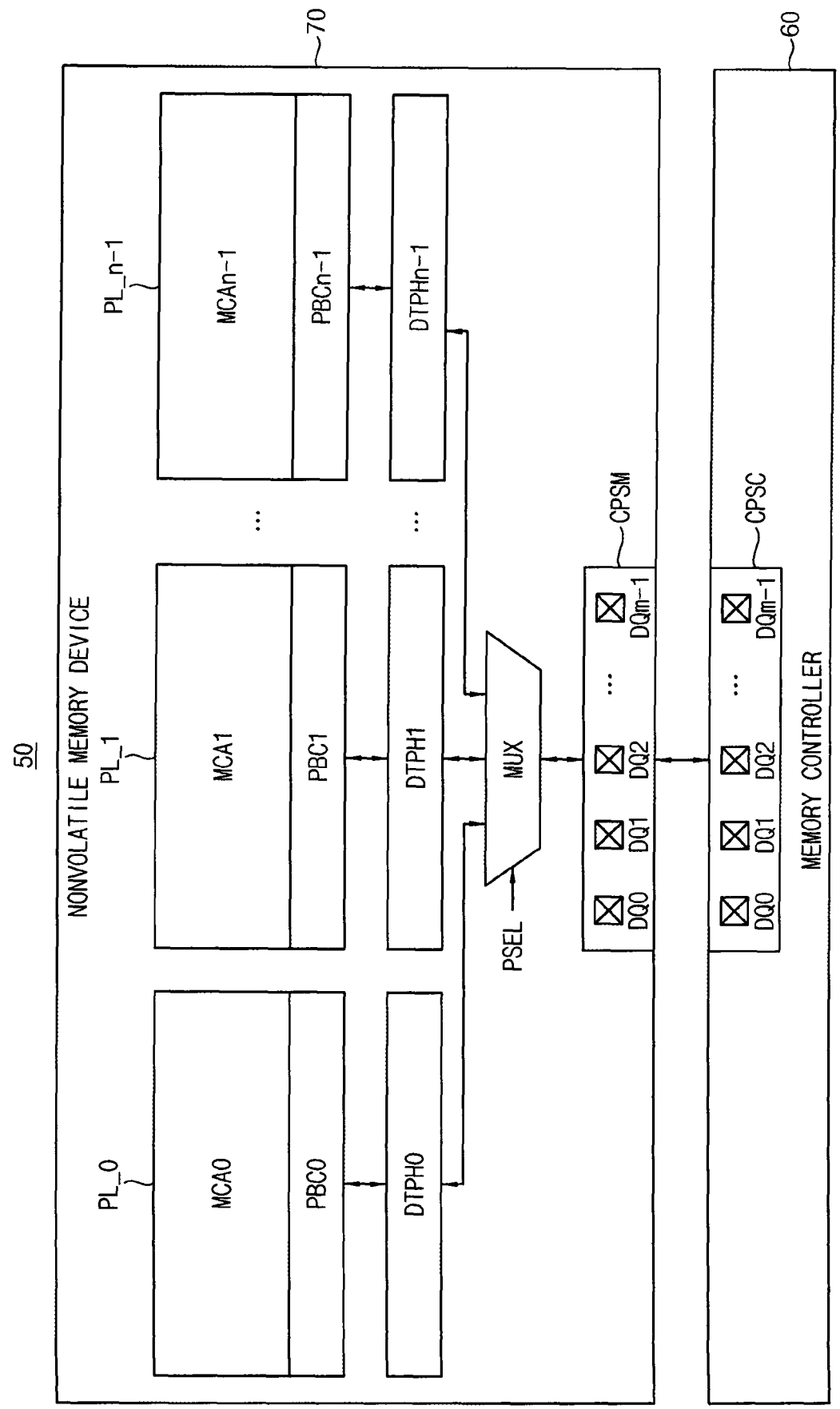
FIG. 11 is a block diagram illustrating a memory system including a nonvolatile memory device of a multiplexing structure.

FIG. 11 is a block diagram illustrating a memory system including a nonvolatile memory device of a multiplexing structure.

Referring to FIG. 11, a memory system 50 includes a memory controller 60 and a memory device 70.

The memory device 70 may be a nonvolatile memory device. The memory system 50 may include data storage media based on flash memory such as a memory card, a universal serial bus (USB) memory and/or a solid state drive (SSD).

The nonvolatile memory device 70 accompanying the routing of data signals may include a plurality of memory planes PL_0~PL_n−1, a plurality of data paths DTPH0~DTPHn−1, a multiplexer MUX and a common pad set CPSM.

Each of the plurality of memory planes PL_0~PL_n−1 may include a respective one of a plurality of memory cell arrays MCA0~MCAn−1 including nonvolatile memory cells and a respective one of a plurality of page buffer circuits PBC0~PBCn−1. Each of the page buffer circuits PBC0~PBCn−1 may be connected to the nonvolatile memory cells included in each of the memory cell arrays MCA0~MCAn−1 through bitlines. In other words, a first memory plane PL_0 includes a first memory cell array MCA0 and a first page buffer circuit PBC0, a second memory plane PL_1 includes a second memory cell array MCA1 and a second page buffer circuit PBC1, and in this way an n-th memory plane PL_n−1 includes an n-th memory cell array MCAn−1 and an n-th page buffer circuit PBCn−1. Each of data paths DTPH0~DTPHn−1 may include a data input-output circuit as described with reference to FIG. 2.

The multiplexer MUX may connect the common pad set CPSM selectively to one of the plurality of data paths DTPH0~DTPHn−1 in response to a plane selection signal PSEL.

The common pad set CPSM may include a plurality of data pads DQ0~DQm−1. The memory controller 60 may include a host pad set CPSC corresponding to the common pad set CPSM. The host pad set CPSC may include a plurality of data pads DQ0~DQm−1 connected to the plurality of data pads DQ0~DQm−1 included in the common pad set CPSM such that each of the plurality of data pads DQ0~DQm−1 of the host pad set CPSC is dedicatedly connected to each of the plurality of data pads DQ0~DQm−1 of the common pad set CPSM.

The nonvolatile memory device 70 having such multiplexing structure requires a circuitry to generate the plane selection signal PSEL based on information on the plane to be selected and the multiplexer MUX to route the data to the selected plane, and such data routing structure may increase the power consumption. In particular, as the basic ×8 structure is extended to ×32, ×64, ×128 and so on, the power consumption may be further increased.

Figure 12:
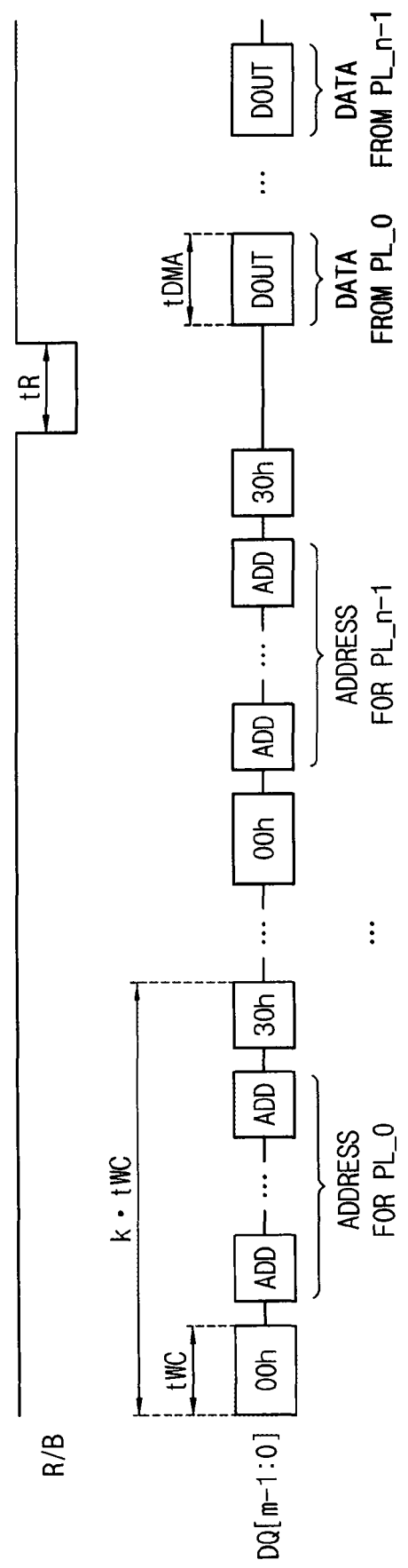
FIG. 12 is a diagram illustrating a multi-plane operation of the nonvolatile memory device of FIG. 11.

FIG. 12 is a diagram illustrating a multi-plane operation of the nonvolatile memory device of FIG. 11.

Referring to FIG. 12, the nonvolatile memory device 70 having the multiplexing structure sequentially receive addresses for the read operations with respect to the plurality of memory planes PL_0~PL_n−1 through the data pads DQ0~DQm−1 included in the common pad set CPSM. The commands 00h and 30h in FIG. 12 are the same as described with reference to FIGS. 6 through 10. tWC indicates a cyclic period of the write enable signal/WE, that is, a write cycle time, and the time k*tWC is required to transfer the address ADD for one memory plane, where k is a positive integer associated with an address cycle number. As a result, the time n*k*tWC is required to transfer the addresses for n memory planes PL_0~PL_n−1. In FIG. 12, tR indicates a data transfer time from the memory cell array to the page buffer circuit. After the time tR is elapsed, the read data DOUT from the memory planes PL_0~PL_n−1 may be output sequentially through the data pads DQ0~DQm−1. When tDMA is a data output time for one memory plane, the time n*tDMA may be required for outputting the read data DOUT for n memory planes PL_0~PL_n−1.

Figure 13:
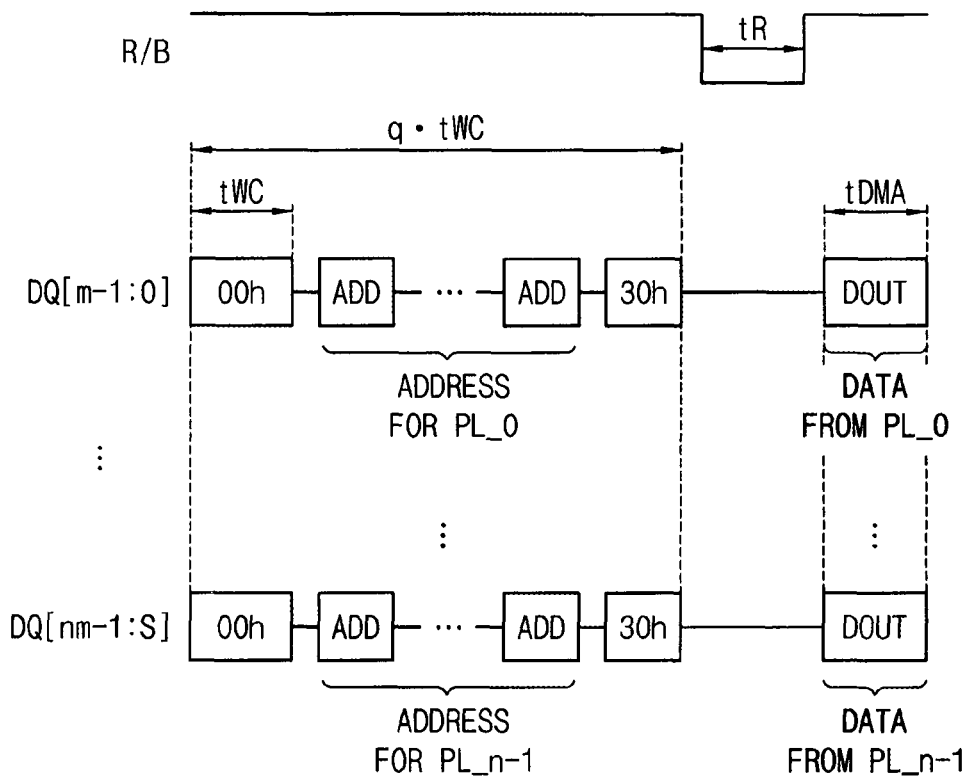
FIG. 13 is a diagram illustrating a multi-plane operation of a nonvolatile memory device according to some examples of embodiments.

FIG. 13 is a diagram illustrating a multi-plane operation of a nonvolatile memory device according to some examples of embodiments.

Referring to FIGS. 1, 2 and 13, the nonvolatile memory device 30 according to some examples of embodiments may simultaneously receive the addresses for the read operations with respect to the plurality of memory planes PL_0~PL_n−1 through the n*m data pads DQ0~DQnm−1 included in the plurality of plane-dedicated pad sets PDPSM_0~PDPSM_n−1. In addition, the nonvolatile memory device 30 may simultaneously output the read data DOUT from the plurality of memory planes PL_0~PL_n−1 through the n*m data pads DQ0~DQnm−1.

As shown in FIGS. 12 and 13, the nonvolatile memory device 30 having the plurality of plane-dedicated pad sets according to some examples of embodiments may decrease the data read time significantly in comparison with the nonvolatile memory device 70 having the multiplexing structure.

In the nonvolatile memory device 30 according to some examples of embodiments, the plurality of plane-dedicated pad sets PDPSM_0~PDPSM_n−1 may receive the read data corresponding to the plurality of memory planes PL_0~PL_n−1 respectively from the plurality of page buffer circuits PBC0~PBCn−1 and simultaneously provide the read data corresponding to the plurality of memory planes PL_0~PL_n−1 to the memory controller 20. In the write operation in the same way as the read operation of FIG. 13, the plurality of plane-dedicated pad sets PDPSM_0~PDPSM_n−1 may simultaneously receive the write data corresponding to the plurality of memory planes PL_0~PL_n−1 from the memory controller 20 through the plurality of data pads respectively included in the plurality of plane-dedicated pad sets PDPSM_0~PDPSM_n−1 and provide the write data corresponding to the plurality of memory planes PL_0~PL_n−1 respectively to the plurality of page buffer circuits PBC0~PBCn−1.

In comparison with the nonvolatile memory device 70 having the multiplexing structure, in the nonvolatile memory device 30 according to some examples of embodiments, the plurality of data pads included in each of the plurality of plane-dedicated pad sets PDPSM_0~PDPSM_n−1 are connected to a corresponding one of the plurality of page buffer circuits PBC0~PBCn−1 and are not connected to the other page buffer circuits through a multiplexer.

As such, the nonvolatile memory device 30 and the memory system 10 according to some examples of embodiments may decrease power consumption using the plurality of plane-dedicated pad sets PDPSM_0~PDPSM_n−1 respectively assigned to the plurality of memory planes PL_0~PL_n−1 by removing data multiplexing and/or signal routing.

Figure 14:
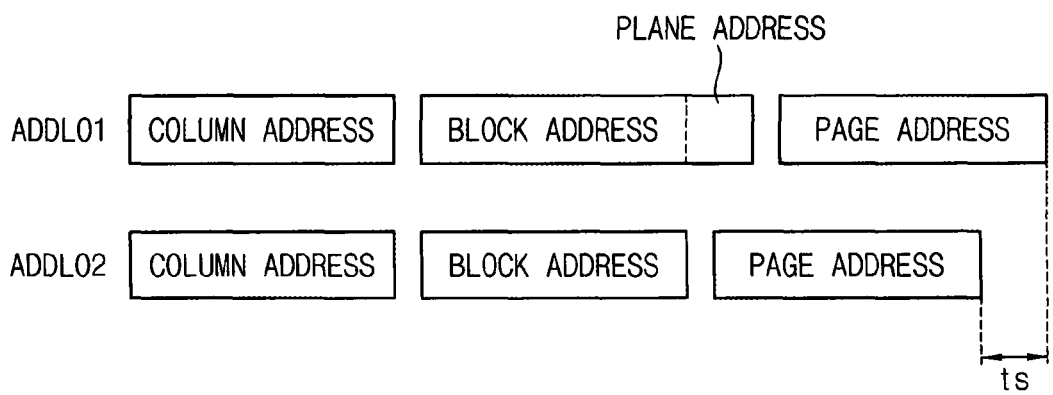
FIG. 14 is a diagram for describing an address layout of a nonvolatile memory device according to some examples of embodiments.

FIG. 14 is a diagram for describing an address layout of a nonvolatile memory device according to some examples of embodiments.

Referring to FIG. 14, a first address layout ADDLO1 corresponds to the nonvolatile memory device 70 having the multiplexing structure as described with reference to FIGS. 11 and 12 and a second address layout ADDLO2 corresponds to the nonvolatile memory device 30 according to some examples of embodiments as described with reference to FIGS. 1, 2 and 13. The nonvolatile memory device 70 having the multiplexing structure receives a plane address for data multiplexing. In contrast, the nonvolatile memory device 30 according to some examples of embodiments does not require the plane address because the commands and addresses for each memory plane may be receive through each plane-dedicated pad set. In other words, the memory controller may transmit the commands and addresses for each memory plane through each host pad set such that the plane address is omitted from the addresses. As a result, the nonvolatile memory device 30 according to some examples of embodiments may reduce the address transfer time by the time is for the plane address transfer in comparison with the nonvolatile memory device 70 having the multiplexing structure. In other words, the time q*tWC in FIG. 13 may be shorter than the time k*tWC in FIG. 12.

FIGS. 15 through 22 are diagrams illustrating example operations of a nonvolatile memory device according to some examples of embodiments. It is assumed that a nonvolatile memory device includes eight memory planes and each plane-dedicated pad set includes eight data pads in the example embodiments of FIGS. 15-22 for convenience of illustration and description, but the numbers of the memory planes and the data pads are not limited thereto.

Figure 15:
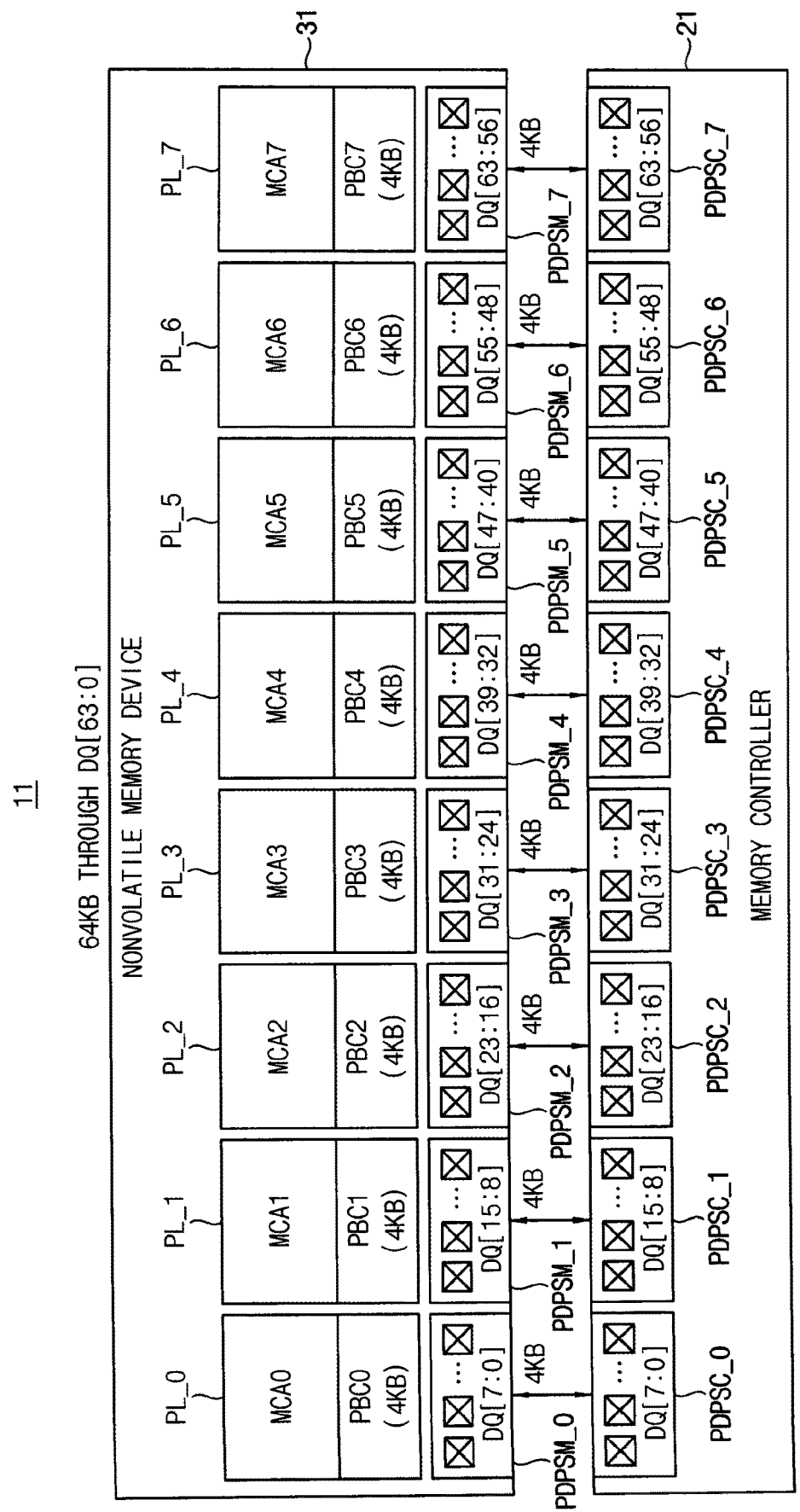
FIGS. 15 through 22 are diagrams illustrating example operations of a nonvolatile memory device according to some examples of embodiments.
Figure 16:
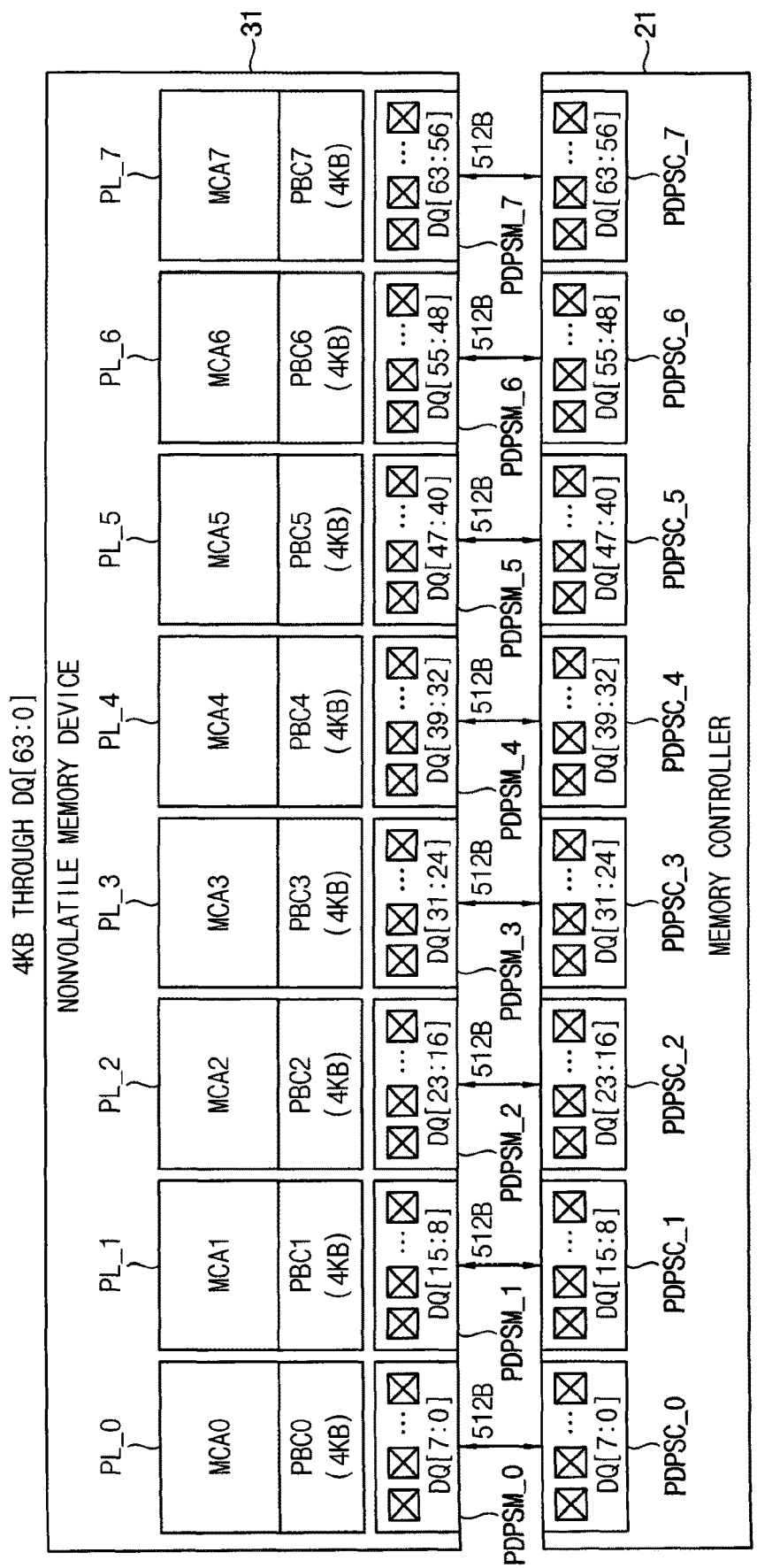
Figure 17:
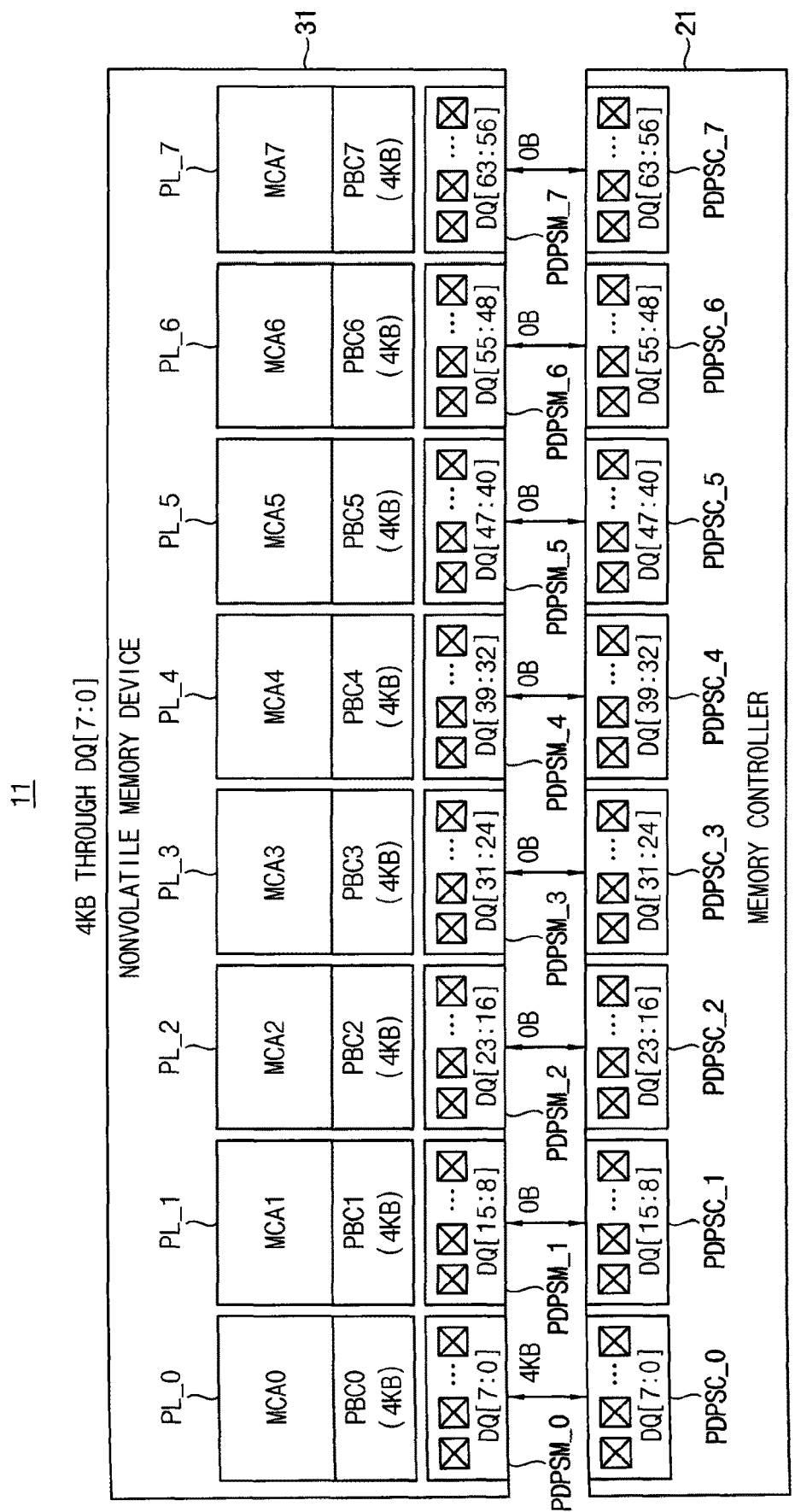

Referring to FIGS. 15, 16 and 17, a memory system 11 may include a memory controller 21 and at least one memory device 31.

The memory device 31 may be a nonvolatile memory device and the memory system 11 may include data storage media based on flash memory such as a memory card, a universal serial bus (USB) memory and/or a solid state drive (SSD).

The nonvolatile memory device 31 may perform a read operation, an erase operation, a program operation, and/or a write operation under control of the memory controller 21. The nonvolatile memory device 31 may receive a command CMD and an address ADD, and may exchange data for the read operation and the program operation with the memory controller 21. In addition, the nonvolatile memory device 31 may receive control signals and power from the memory controller 21.

The nonvolatile memory device 31 may include a plurality of memory planes, for example, eight memory planes PL_0~PL7, eight data paths (not shown) as described above, and eight plane-dedicated pad sets PDPSM_0~PDPSM_7.

Each of the eight memory planes PL_0~PL_7 may include each of eight memory cell arrays MCA0~MCA7 including nonvolatile memory cells and each of eight page buffer circuits PBC0~PBC7. Each of the eight page buffer circuits PBC0~PBC7 may be connected to the nonvolatile memory cells included in each of the eight memory cell arrays MCA0~MCA7 through bitlines. In other words, a first memory plane PL_0 may include a first memory cell array MCA0 and a first page buffer circuit PBC0, a second memory plane PL_1 may include a second memory cell array MCA1 and a second page buffer circuit PBC1, and in this way an eighth memory plane PL_7 may include an eighth memory cell array MCAT and an eighth page buffer circuit PBC7. In some examples of embodiments, a size of each of the page buffer circuits PBC0~PBC7 may correspond to a page size or a number of bitlines of each memory plane.

Each of the eight plane-dedicated pad sets PDPSM_0~PDPSM_7 may include eight data pads. For example, the first plane-dedicated pad set PDPSM_0 may include eight data pads DQ0~DQ7, the second plane-dedicated pad set PDPSM_1 may include eight data pads DQ8~DQ15, and in this way the eighth plane-dedicated pad set PDPSM_7 may include eight data pads DQ56~DQ63. In other words, each of the eight plane-dedicated pad sets PDPSM_0~PDPSM_7 may include eight data pads, respectively, and the total number of the data pads DQ0~DQ63 may be 8*8=64.

The memory controller 21 may include eight host pad sets PDPSC_0~PDPSC_7 that are connected to the eight plane-dedicated pad sets PDPSM_0~PDPSM_7 respectively one by one such that each of the eight host pad sets PDPSC_0~PDPSC7 is dedicatedly connected to each of the eight plane-dedicated pad sets PDPSM_0~PDPSM_7. Each of the eight host pad sets PDPSC_0~PDPSC_7 may include eight host data pads connected to the eight data pads included in each of the eight plane-dedicated pad sets PDPSM_0~PDPSM_7 such that each of the eight host data pads is dedicatedly connected to each of the eight data pads. In other words, each of the first host pad set PDPSC_0 and the first plane-dedicated pad set PDPSM_0 may include the eight data pads DQ0~DQ7, each of the second host pad set PDPSC_1 and the second plane-dedicated pad set PDPSM_1 may include the eight data pads DQ8~DQ15, and in this way each of the eighth host pad set PDPSC_7 and the eighth plane-dedicated pad set PDPSM_7 may include the eight data pads DQ56~DQ63.

FIGS. 15, 16 and 17 illustrates examples of an input-output mapping structure. As illustrated in FIG. 15, the write operation and the read operation may be performed by units of 32 KB in the structure of the eight memory planes and the page size of 4 KB. When only the 4 KB data are read or written, two scenarios may be implemented. Firstly, through the multi-plane operation with respect to the eight memory planes PL_0~PL_7 as illustrated in FIG. 16, each memory plane may operate by unit of 512B. In this case, 4 KB may be read out from each memory plane and then random read operation may be performed by unit of 512B. Secondly, the random read operation may be required with respect to a particular memory plane, for example, the first memory plane PL_0 as illustrated in FIG. 17. In this case, only the particular memory plane PL_0 may be enabled and the other memory planes PL_1~PL_7 may be disabled.

As such, the nonvolatile memory device 31 may receive the commands and the addresses from the memory controller 21 through the plurality of data pads included in a portion of the plurality of plane-dedicated pad sets PDPSM_0~PDPSM_7 to perform a read operation or a write operation with respect to a portion of the plurality of memory planes PL_0~PL_7 corresponding to the portion of the plurality of plane-dedicated pad sets PDPSM_0~PDPSM_7. The internal configuration of the nonvolatile memory device may be implemented depending on a high bandwidth sequential read operation or a random read operation.

Figure 18:
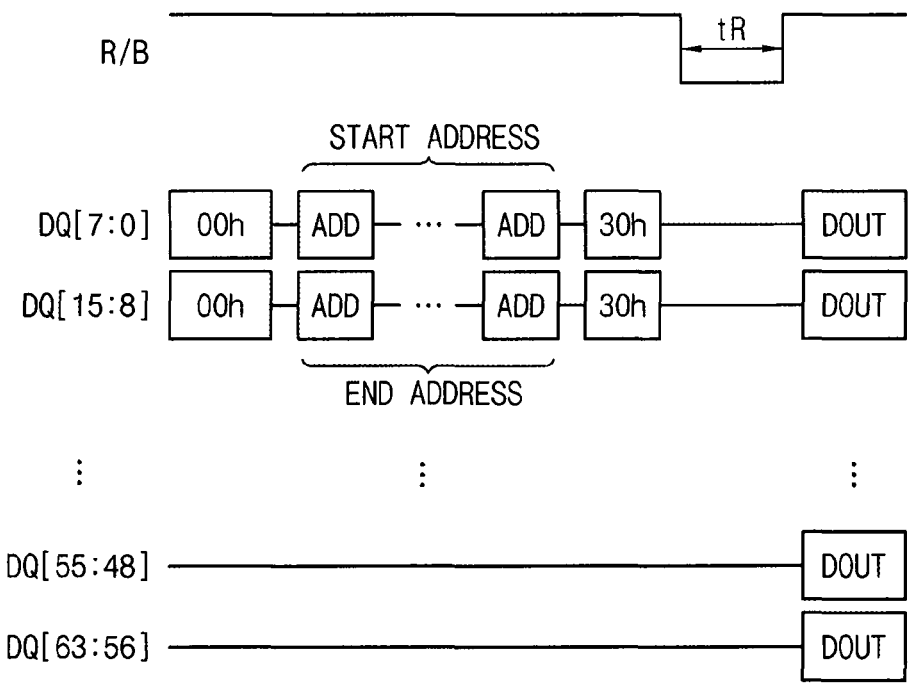

Referring to FIG. 18, the nonvolatile memory device 31 including the plurality of plane-dedicated pad sets PDPSM_0~PDPSM_7 may receive a start address for a read operation or a write operation through the plurality of data pads DQ[7:0] included in one of the plurality of plane-dedicated pad sets PDPSM_0~PDPSM_7 and receive an end address for the read operation and the write operation through the plurality of data pads DQ[15:8] included in another one of the plurality of plane-dedicated pad sets PDPSM_0~PDPSM_7. FIG. 18 illustrates an example of the read operation and the write operation may be implemented similarly.

The memory controller 21 including the plurality of host pad sets PDPSC_0~PDPSC_7 may transmit the start address for the read operation or the write operation through the plurality of host data pads DQ[7:0] included in one of the plurality of host pad sets PDPSC_0~PDPSC_7, and may transmit the end address for the read operation or the write operation through the plurality of host data pads DQ[15:8] included in another one of the plurality of host pad sets PDPSC_0~PDPSC_7.

Figure 19:
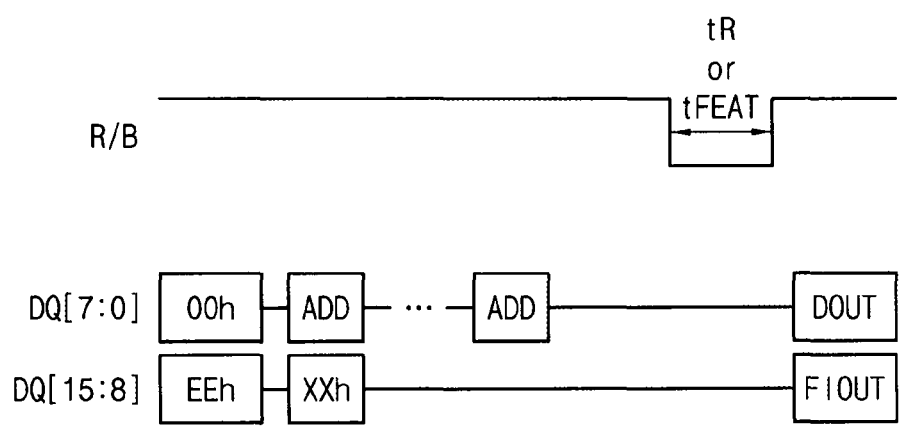
Figure 20:
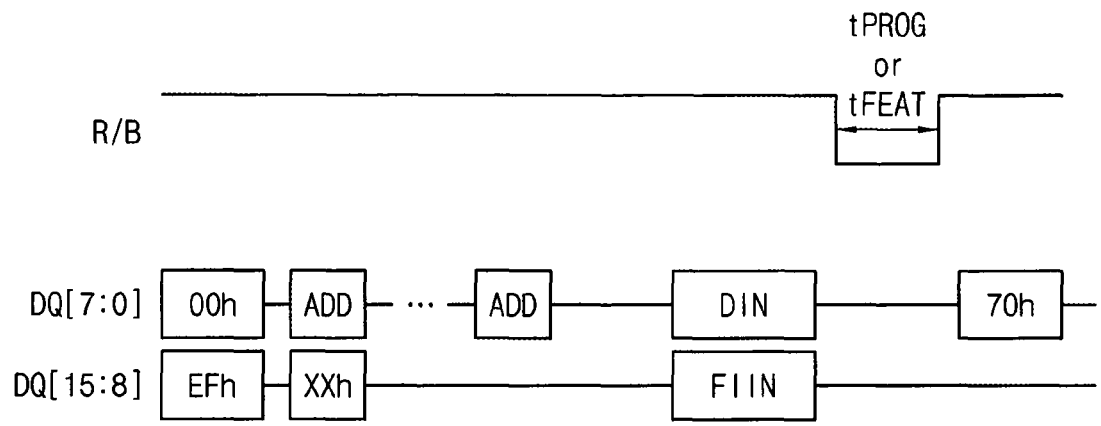

Referring to FIGS. 19 and 20, the nonvolatile memory device 31 including the plurality of plane-dedicated pad sets PDPSM_0~PDPSM_7 may receive the write data or output the read data through the plurality of data pads DQ[7:0] included in one of the plurality of plane-dedicated pad sets PDPSM_0~PDPSM_7, and may output feature information FIOUT indicating an operational condition of the nonvolatile memory device 31 as illustrated in FIG. 19 or receive feature information FIIN as illustrated in FIG. 20 through the plurality of data pads DQ[15:8] included in another one of the plurality of plane-dedicated pad sets PDPSM_0~PDPSM_7.

The memory controller 21 including the plurality of host pad sets PDPSC_0~PDPSC_7 may transmit the write data or receive the read data through the plurality of host data pads DQ[7:0] included in one of the plurality of host pad sets PDPSC_0~PDPSC_7, and may receive the feature information FIOUT as illustrated in FIG. 19 or transmit the feature information FIIN as illustrated in FIG. 20 through the plurality of host data pads DQ [15:8] included in another one of the plurality of host pad sets PDPSC_0~PDPSC_7.

Figure 21:
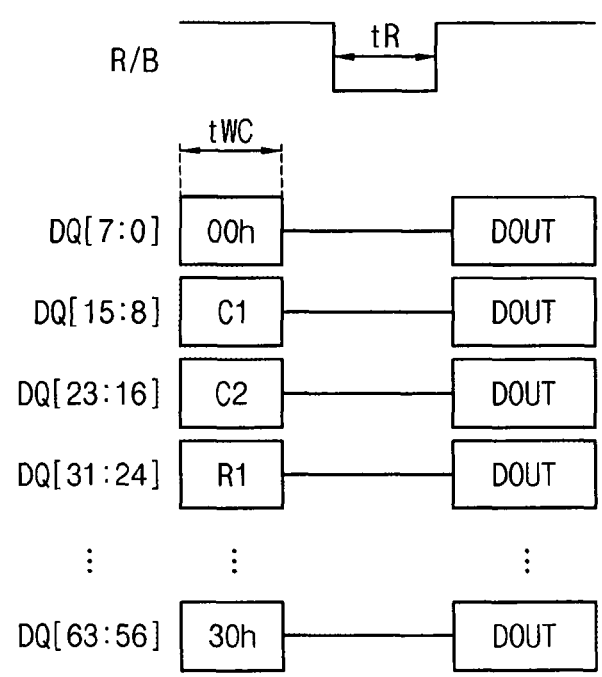

Referring to FIG. 21, the nonvolatile memory device 31 including the plurality of plane-dedicated pad sets PDPSM_0~PDPSM_7 may simultaneously receive the commands and the addresses through the plurality of data pads DQ[7:0]~DQ[63:56] included in at least two of the plurality of plane-dedicated pad sets PDPSM_0~PDPSM_7. Accordingly the transfer time of the commands and the addresses may be further reduced.

The memory controller 21 including the plurality of host pad sets PDPSC_0~PDPSC_7 may simultaneously transmit the commands and the addresses through the plurality of host data pads DQ[7:0]~DQ[63:56] included in at least two of the plurality of host pad sets PDPSC_0~PDPSC_7.

Figure 22:
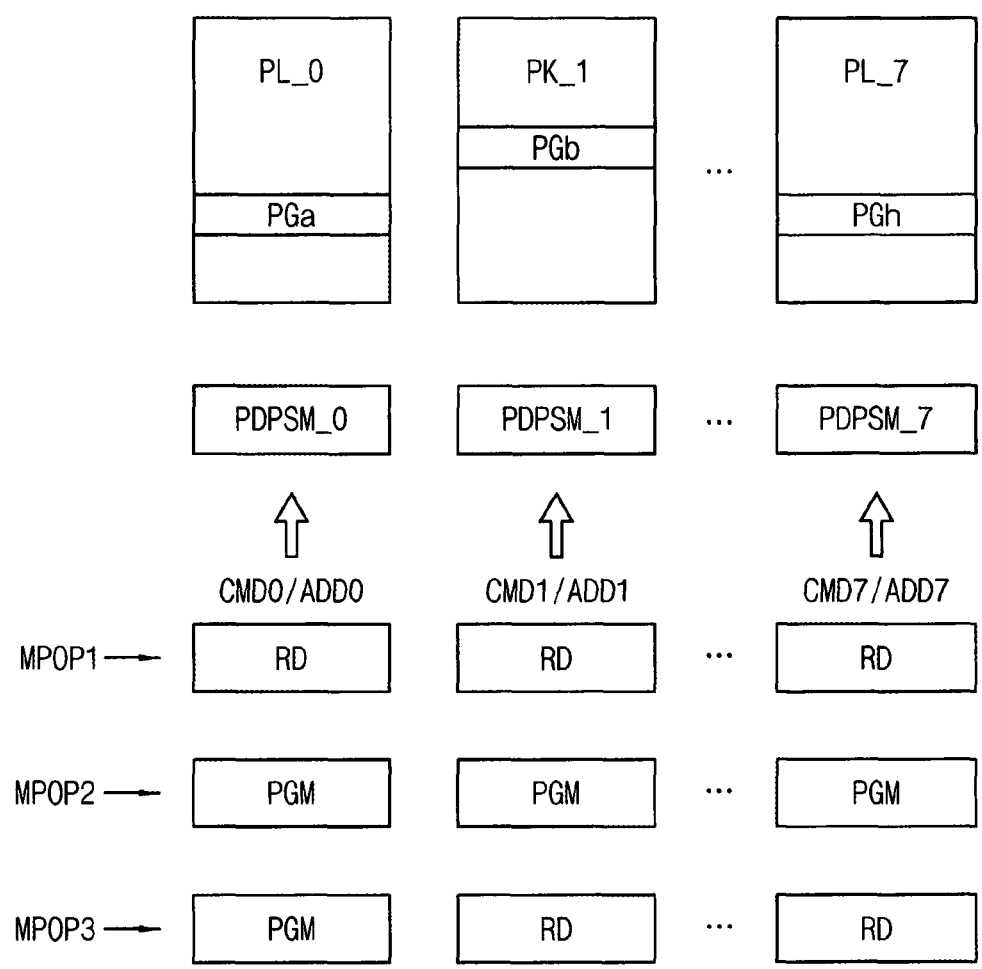

Referring to FIG. 22, the nonvolatile memory device 31 including the plurality of plane-dedicated pad sets PDPSM_0~PDPSM_7 may perform a first multi-plane operation MPOP1, a second multi-plane operation MPOP2, and/or a third multi-plane operation MPOP3. In the first multi-plane operation MPOP1, the nonvolatile memory device 31 may perform the read operation RD with respect to all of the memory planes PL_0~PL_7. In the second multi-plane operation MPOP2, the nonvolatile memory device 31 may perform the write operation PGM with respect to all of the memory planes PL_0~PL_7. In the third multi-plane operation MPOP3, the nonvolatile memory device 31 may perform the read operation RD with respect to a portion of the plurality of memory planes PL_0~PL_7 using the plurality of data pads included in a portion of the plurality of plane-dedicated pad sets PDPSM_0~PDPSM_7 corresponding to the portion of the plurality of memory planes PL_0~PL_7 while the nonvolatile memory device 31 performs the write operation PGM with respect to another portion of the plurality of memory planes PL_0~PL_7 using the plurality of data pads included in another portion of the plurality of plane-dedicated pad sets PDPSM_0~PDPSM_7 corresponding to the another portion of the plurality of memory planes PL_0~PL_7.

For such various multi-plane operations, the nonvolatile memory device 31 may receive the commands CMD0~CMD7 and the addresses ADD0~ADD7 corresponding to each of the plurality of memory planes PL_0~PL_7 through the plurality of data pads included in each of the plurality of plane-dedicated pad sets PDPSM_0~PDPSM_7 independently per memory plane. The addresses ADD0~ADD7 corresponding to each of the plurality of memory planes PL_0~PL_7 may be determined independently, and thus the operations may be performed with respect to different memory blocks and/or the different pages PGa, PGb and PGh as illustrated in FIG. 22.

Figure 23:
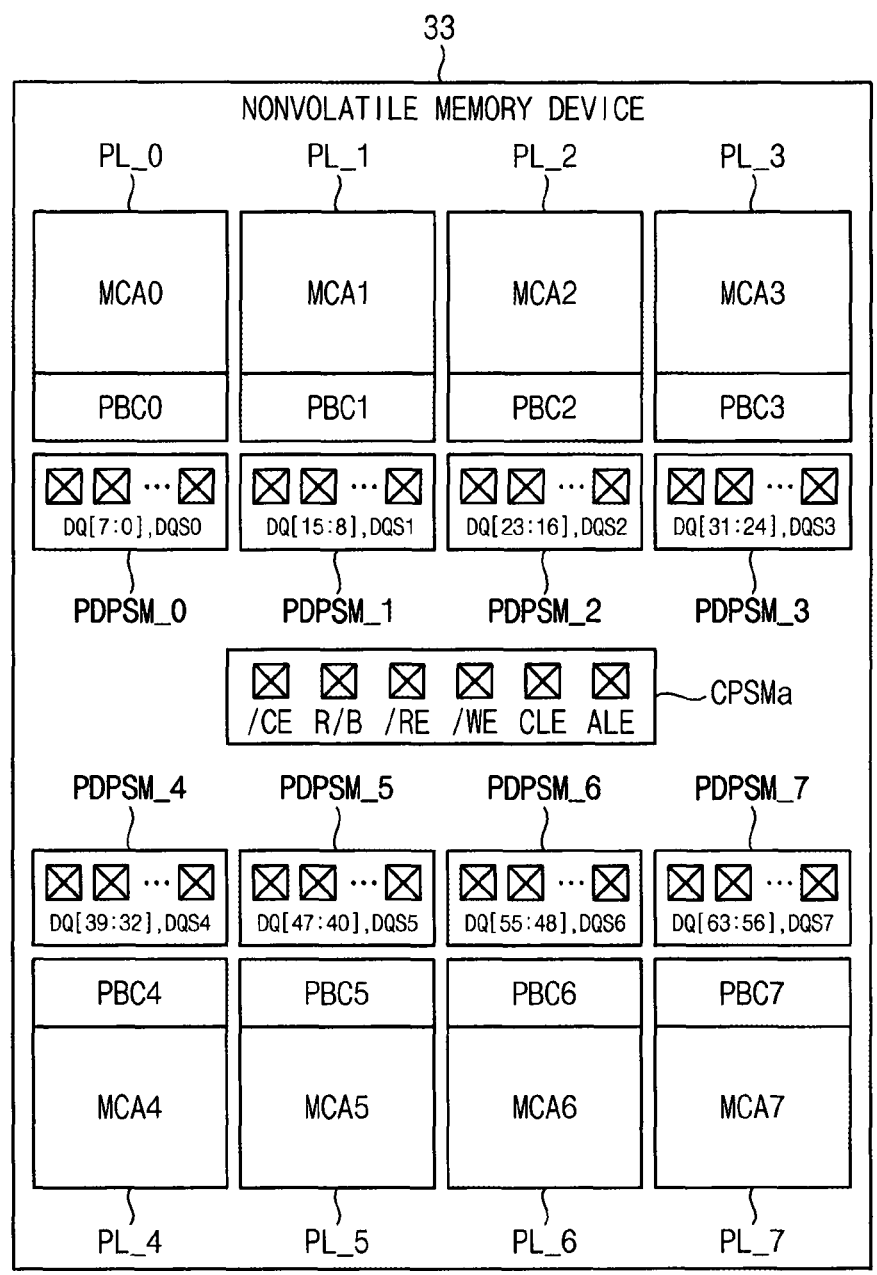
FIGS. 23, 24 and 25 are diagrams illustrating example layouts of a nonvolatile memory device according to some examples of embodiments.
Figure 24:
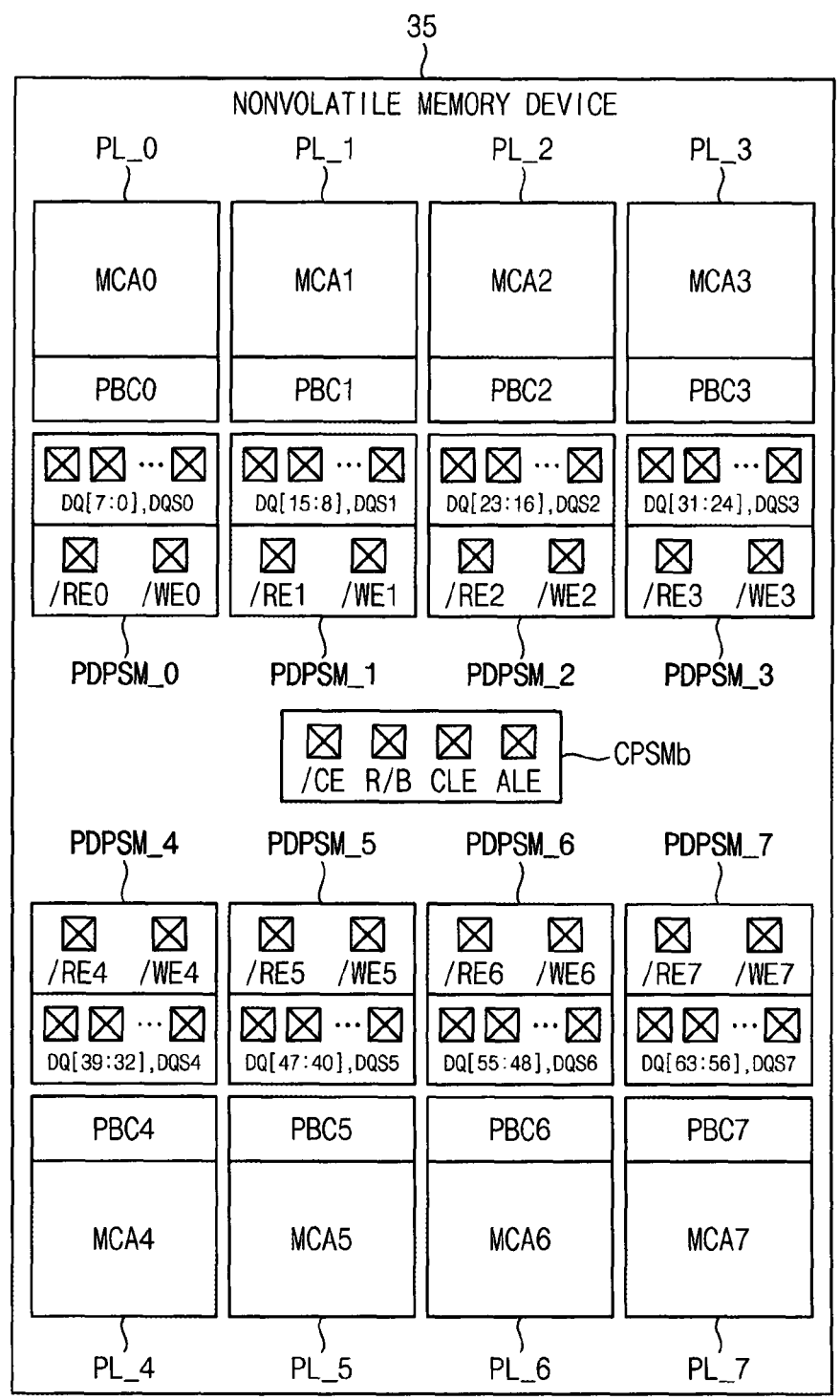
Figure 25:
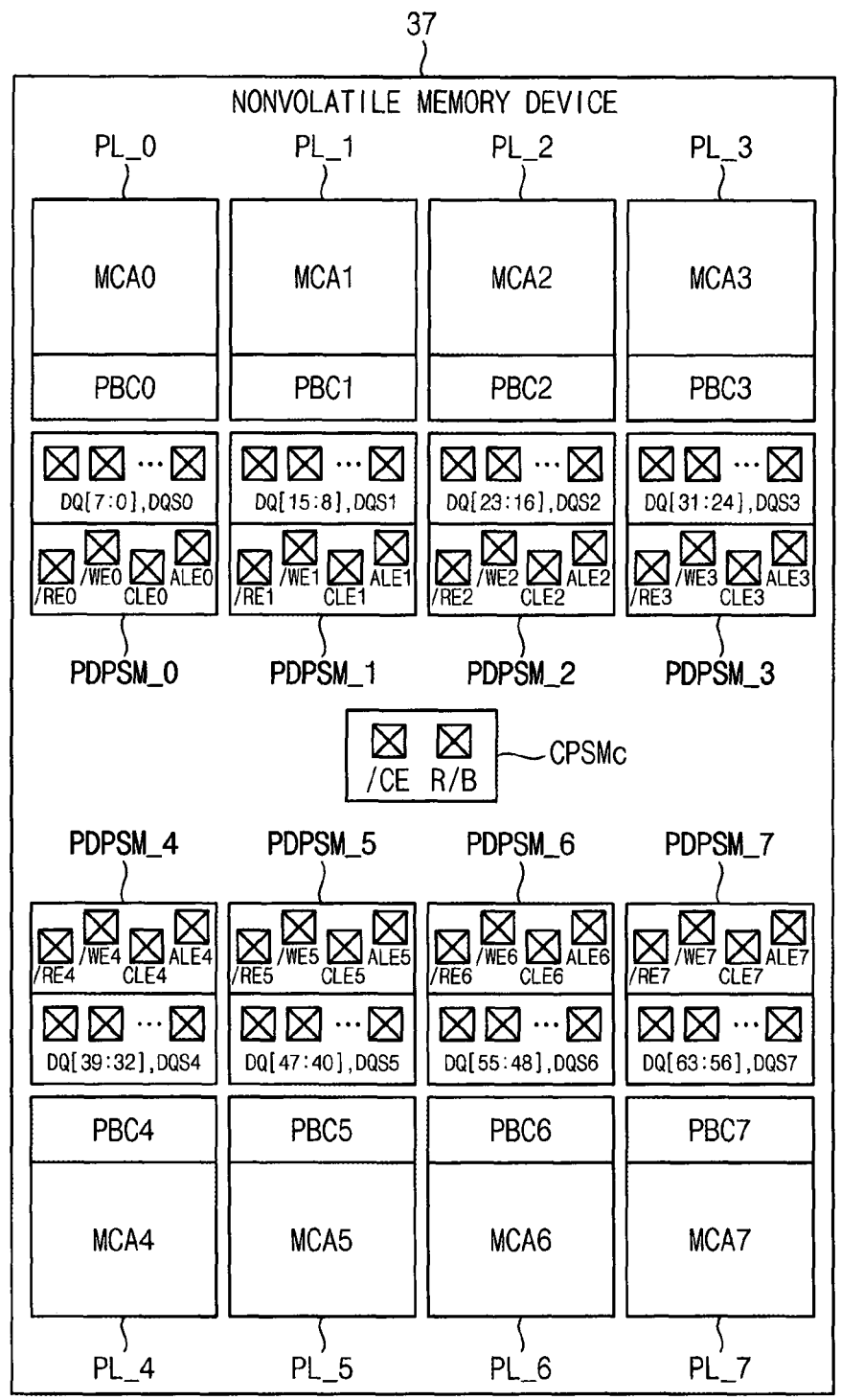

FIGS. 23, 24 and 25 are diagrams illustrating example layouts of a nonvolatile memory device according to some examples of embodiments. For convenience of illustration and description, the reference numerals of pads in FIGS. 23, 24 and 25 are the same as the reference numerals of the signals in FIGS. 6 through 10.

Referring to FIGS. 23, 24 and 25, each of the plane-dedicated pad sets PDPSM_0~PDPSM_7 may further include a pad configured to receive each of data strobe signals DQS0~DQS7 provided from a memory controller. As illustrated in FIGS. 6 through 10, the nonvolatile memory device may receive the write data through the plurality of data pads included in each of the plurality of plane-dedicated pad sets PDPSM_0~PDPSM_7 in synchronization with transitions of the data strobe signal DQS.

As illustrated in FIGS. 23, 24 and 25, each of the plane-dedicated pad sets PDPSM_0~PDPSM_7 may further include at least one control pad configured to receive at least one control signal provided from the memory controller for dedicatedly controlling operations of each of the plurality of memory planes PL_0~PL_7 corresponding to each of the plurality of plane-dedicated pad sets PDPSM_0~PDPSM_7.

In the nonvolatile memory device 33 of FIG. 23, all of the control pads /CE, R/B, /RE, /WE, CLE and ALE may be included in the common pad set CPSMa. In the nonvolatile memory device 35 of FIG. 24, the control pads/CE, RB, CLE and ALE may be included in the common pad set CPSMb and the control pads /RE0~/RE7 and/WE0~/WE7 may be included in each of the plane-dedicated pad sets PDPSM_0~PDPSM_7. In the nonvolatile memory device 37 of FIG. 25, the control pads/CE and RB may be included in the common pad set CPSMc and the control pads /RE0~/RE7, /WE0~/WE7, CLE0~CLE7 and ALE0~ALE7 may be included in each of the plane-dedicated pad sets PDPSM_0~PDPSM_7.

As illustrated in FIGS. 23, 24 and 25, the plane-dedicated pad sets PDPSM_0~PDPSM_7 may be disposed at a center portion of a semiconductor die in which the nonvolatile memory device is formed such that each of the plurality of plane-dedicated pad sets PDPSM_0~PDPSM_7 may be adjacent to each of the plurality of memory planes PL_0~PL_7. Such structure may be referred to as a center pad structure of a wide input-output structure. The overhead due to signal routing and the power consumption may be reduced because the connection lengths between the data pads and the page buffers may be shortened in the center pad structure. The connection between the pads and package balls may be implemented using redistribution layer (RDL).

Figure 26:
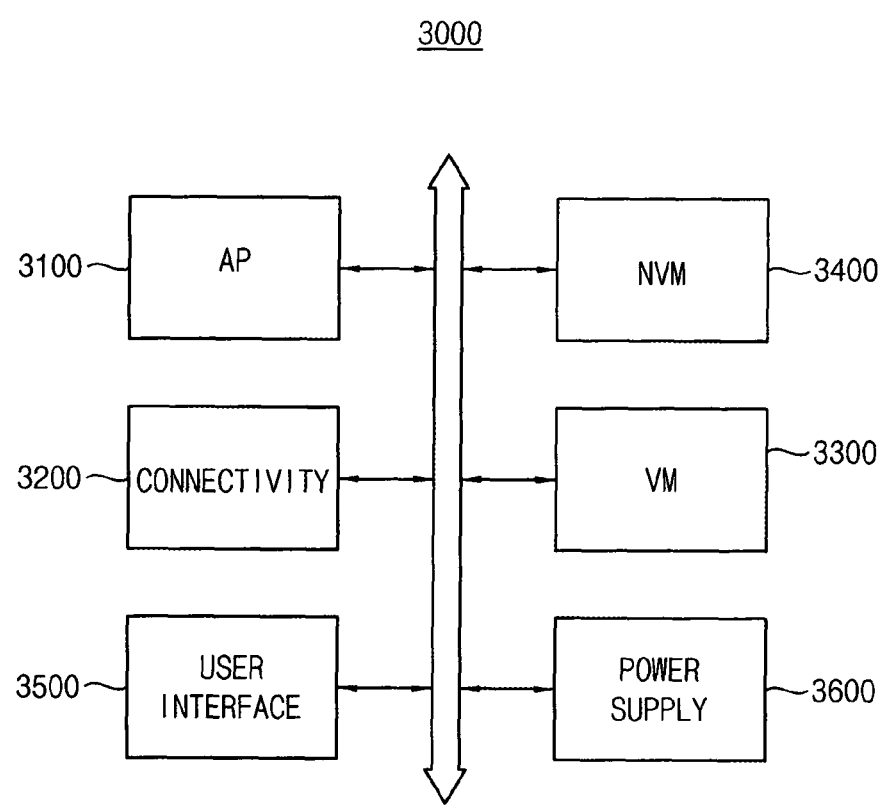
FIG. 26 is a block diagram illustrating a mobile system including a nonvolatile memory device according to some examples of embodiments.

FIG. 26 is a block diagram illustrating a mobile system including a nonvolatile memory device according to some examples of embodiments.

Referring to FIG. 26, a mobile system 3000 includes an application processor AP 3100, a connectivity unit 3200, a volatile memory device VM 3300, a nonvolatile memory device NVM 3400, a user interface 3500, and a power supply 3600 connected via a bus.

The application processor 3100 may execute applications such as a web browser, a game application, a video player, etc. The connectivity unit 3200 may perform wired or wireless communication with an external device. The volatile memory device 3300 may store data processed by the application processor 3100, or may operate as a working memory. For example, the volatile memory device 3300 may be a DRAM, such as a double data rate synchronous dynamic random access memory (DDR SDRAM), low power DDR (LPDDR) SDRAM, graphics DDR (GDDR) SDRAM, Rambus DRAM (RDRAM), etc. The nonvolatile memory device 3400 may store a boot image for booting the mobile system 3000 and other data. The user interface 3500 may include at least one input device, such as a keypad, a touch screen, etc., and at least one output device, such as a speaker, a display device, etc. The power supply 3600 may supply a power supply voltage to the mobile system 3000. In some examples of embodiments of the present inventive concepts, the mobile system 3000 may further include a camera image processor (CIS), and/or a storage device, such as a memory card, a solid state drive (SSD), a hard disk drive (HDD), a compact disc read only memory (CD-ROM), etc.

The nonvolatile memory device 3400 may include a plurality of plane-dedicated pad sets as described with reference to FIGS. 1 through 25. As described above, each of the plurality of plane-dedicated pad sets may include a plurality of data pads connected dedicatedly to each of the plurality of page buffer circuits through each of the plurality of data paths such that the plurality of data pads receive write data from a memory controller to provide the write data to each of the plurality of page buffer circuits and receive read data from each of the plurality of page buffer circuits to provide the read data to the memory controller.

Figure 27:
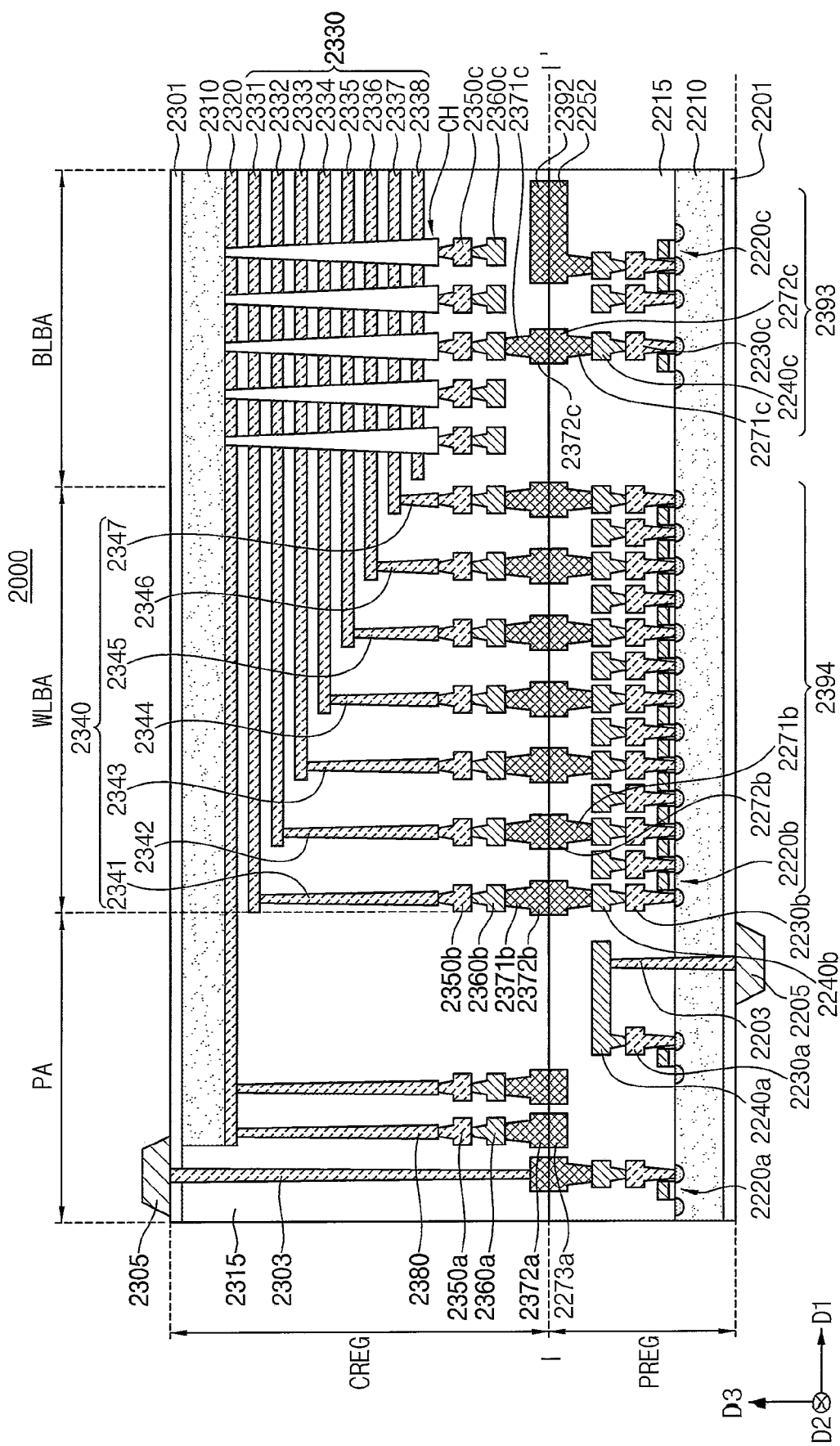
FIG. 27 is a cross-sectional diagram illustrating a nonvolatile memory device according to some examples of embodiments.

FIG. 27 is a cross-sectional diagram illustrating a nonvolatile memory device according to example embodiments.

Referring to FIG. 27, a nonvolatile memory device 2000 may have a chip-to-chip (C2C) structure. Here, the term "C2C structure" denotes a structure in which an upper chip and a lower chip are bonded together at a bonding surface (indicated by I-I' in FIG. 27) by a bonding process. The upper chip may include a memory cell region (e.g., the cell region CREG) on a first wafer, and a lower chip may include a peripheral circuit region (e.g., the peripheral region PREG) on a second wafer, although the present disclosure is not limited thereto. The bonding process may include a method of electrically connecting a bonding metal formed on a lowermost metal layer of the upper chip and a bonding metal formed on an uppermost metal layer of the lower chip. As an example, the bonding metals may include copper (Cu), and a Cu-to-Cu bonding process may be utilized. Example embodiments, however, are not limited thereto. For example, the bonding metals may also be formed of aluminum (Al) or tungsten (W). The upper chip may be inverted prior to or as part of the bonding process (e.g., an uppermost fabricated metal layer of the upper chip may become the lowermost metal layer used for bonding the upper chip with the lower chip).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some examples of embodiments, the first metal layers 2230a, 2230b, and 2230c may be formed of a first metal (e.g., tungsten (W)) having a relatively high electrical resistivity, and the second metal layers 2240a, 2240b, and 2240c may be formed of a second metal (e.g., copper (Cu)) having a relatively low electrical resistivity.

FIG. 27, shows the first metal layers 2230a, 2230b, and 2230c and the second metal layers 2240a, 2240b, and 2240c, with the understanding that example embodiments are not limited thereto. For example, in some embodiments, one or more additional metal layers may be further formed on the second metal layers 2240a, 2240b, and 2240c. At least a portion of the one or more additional metal layers formed on the second metal layers 2240a, 2240b, and 2240c may be formed of a third metal, for example, aluminum (Al) or the like having a lower electrical resistivity than those of the second metal forming the second metal layers 2240a, 2240b, and 2240c.

The interlayer insulating layer 2215 may be on the first substrate 2210 and may cover the circuit elements 2220a, 2220b, and 2220c, the first metal layers 2230a, 2230b, and 2230c, and the second metal layers 2240a, 2240b, and 2240c (as well as any additional metal layers). The interlayer insulating layer 2215 may include an insulating material such as, for example, silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may be formed of, for example, aluminum, copper, tungsten, or the like. The upper bonding metals 2371b and 2372b in the cell region CREG may be referred as first metal pads, and the lower bonding metals 2271b and 2272b in the peripheral region PREG may be referred as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, wordlines 2330) may be vertically stacked (in the third direction D3 or a Z-axis) perpendicular to an upper surface of the second substrate 2310. At least one string selection line and at least one ground selection line (not shown) may be arranged on and below the wordlines 2330, respectively, and the wordlines 2330 may be between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350c and a second metal layer 2360c. For example, the first metal layer 2350c may be a bitline contact, and the second metal layer 2360c may be a bitline. In some examples of embodiments, the bitline (the second metal layer 2360c) may extend in a second horizontal direction D2 (e.g., a Y-axis direction) parallel to the upper surface of the second substrate 2310.

In the illustrated example of FIG. 27, an area in which the channel structure CH, the bitline (the second metal layer 2360c), and the like are disposed may be defined as the bitline bonding area BLBA. In the bitline bonding area BLBA, the bitline (the second metal layer 2360c) may be electrically connected to the circuit elements 2220c providing a page buffer 2393 in the peripheral region PREG. The bitline (the second metal layer 2360c) may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, cell contact plugs 2340). The wordlines 2330 and the cell contact plugs 2340 may be connected to each other by pads provided by at least a portion of the wordlines 2330 extending in different lengths in the first horizontal direction D1. A first metal layer 2350b and a second metal layer 2360b may be connected to a lower portion of the cell contact plugs 2340 connected to the wordlines 2330. The cell contact plugs 2340 may be connected to the peripheral region PREG by the upper bonding metals 2371b and 2372b of the cell region CREG and the lower bonding metals 2271b and 2272b of the peripheral region PREG.

The cell contact plugs 2340 may be electrically connected to the circuit elements 2220b forming a row decoder 2394 in the peripheral region PREG. In some examples of embodiments, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

One or more common source line contact plugs 2380 may be in the external pad bonding area PA. The common source line contact plug 2380 may be formed of a conductive material such as, for example, a metal, a metal compound, polysilicon, or the like, and may be electrically connected to the common source line 2320. A first metal layer 2350a and a second metal layer 2360a may be stacked on a lower portion of the common source line contact plug 2380. The external pad bonding area PA may be defined as an area in which the common source line contact plug 2380, the first metal layer 2350a, and the second metal layer 2360a are arranged.

I/O pads 2205 and 2305 may be also arranged in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c in the peripheral region PREG through a first I/O contact plug 2203, and may be separated from the first substrate 2210 by the lower insulating film 2201. In addition, a side insulating film may be between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be on the upper insulating film 2301. The second I/O pad 2305 may be connected to at least one of the circuit elements 2220a, 2220b, and 2220c in the peripheral region PREG through a second I/O contact plug 2303. In some examples of embodiments, the second I/O pad 2305 is electrically connected to a circuit element 2220a.

In some examples of embodiments, the second substrate 2310 and the common source line 2320 are absent from an area in which the second I/O contact plug 2303 is arranged. Also, in some embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310 (e.g., the X-axis direction), and may pass through an interlayer insulating layer 2315 of the cell region CREG to be connected to the second I/O pad 2305.

According to some examples of embodiments, the first I/O pad 2205 and the second I/O pad 2305 may be selectively formed. For example, in some embodiments, the nonvolatile memory device 2000 may include only the first I/O pad 2205 disposed on the first substrate 2210 or the second I/O pad 2305 disposed on the second substrate 2310. Alternatively, in some examples of embodiments, the memory device 200 may include both the first I/O pad 2205 and the second I/O pad 2305.

According to some examples of embodiments, a metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273a, corresponding to an upper metal pattern 2372a formed in a metal layer of the cell region CREG, and having the same cross-sectional shape as the upper metal pattern 2372*a* of the cell region CREG so as to be connected to each other, in a metal layer of the peripheral region PREG. In some examples of embodiments, in the peripheral region PREG, the lower metal pattern 2273*a* formed in the metal layer of the peripheral region PREG is not connected to a contact. In the external pad bonding area PA, an upper metal pattern 2372*a*, corresponding to the lower metal pattern 2273*a* formed in a metal layer of the peripheral region PREG, and having the same shape as a lower metal pattern 2273*a* of the peripheral region PREG, may be formed in a metal layer of the cell region CREG.

The lower bonding metals 2271*b* and 2272*b* may be formed on the second metal layer 2240*b* in the wordline bonding area WLBA. In the wordline bonding area WLBA, the lower bonding metals 2271*b* and 2272*b* of the peripheral region PREG may be electrically connected to the upper bonding metals 2371*b* and 2372*b* of the cell region CREG by, for example, Cu-to-Cu bonding.

Further, in the bitline bonding area BLBA, an upper metal pattern 2392, corresponding to a lower metal pattern 2252 formed in a metal layer of the peripheral region PREG, and having the same cross-sectional shape as the lower metal pattern 2252 of the peripheral region PREG, may be formed in a metal layer of the cell region CREG. In some examples of embodiments, a contact is not formed on the upper metal pattern 2392 formed in the uppermost metal layer of the cell region CREG.

Figure 28:
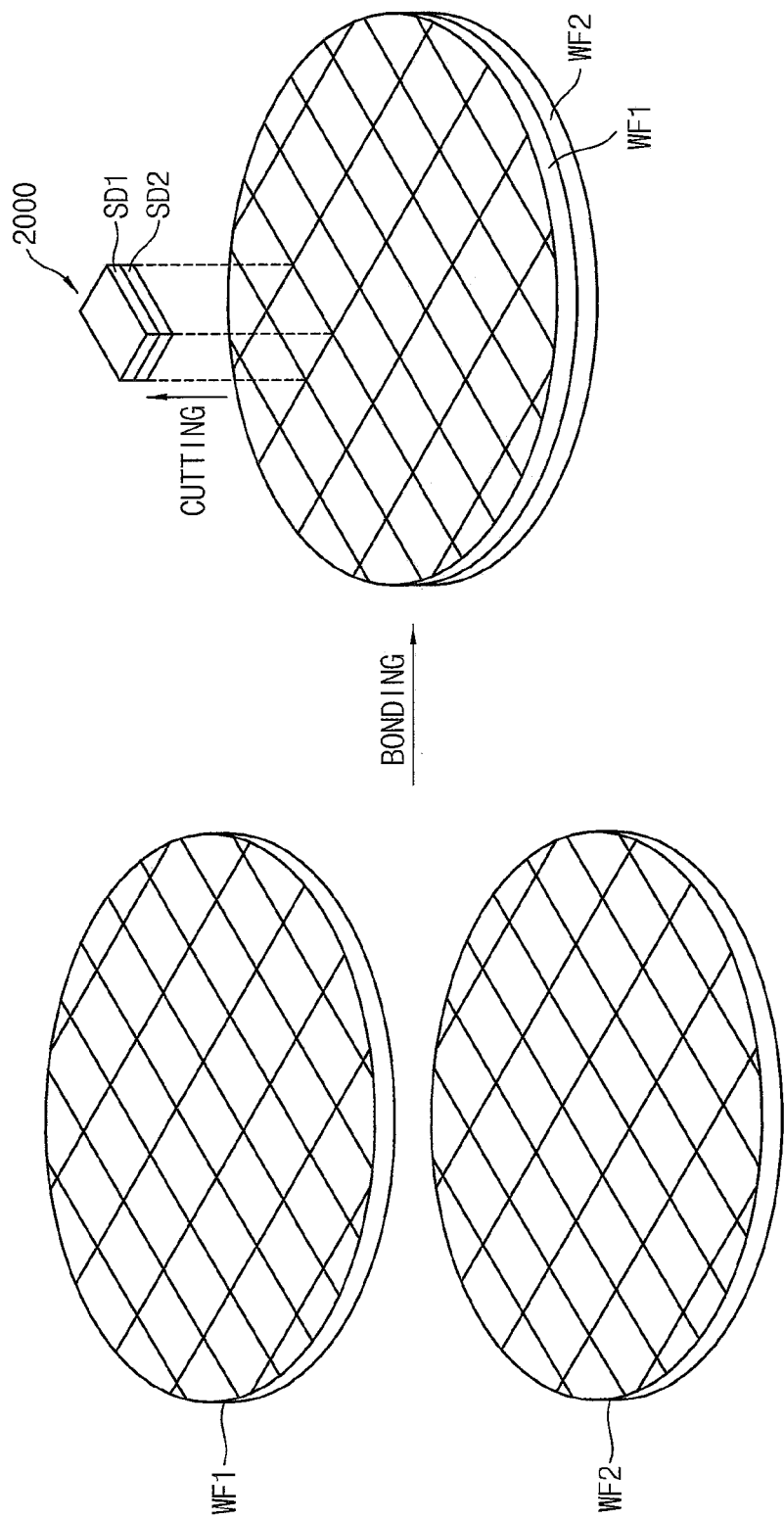
FIG. 28 is a conceptual diagram illustrating manufacture of a stacked semiconductor device according to some examples of embodiments.

FIG. 28 is a conceptual diagram illustrating manufacture of a stacked semiconductor device according to example embodiments.

Referring to FIG. 28, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. One of the first and second wafers WF1 and WF2 may be inverted prior to bonding. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

Figure 29:
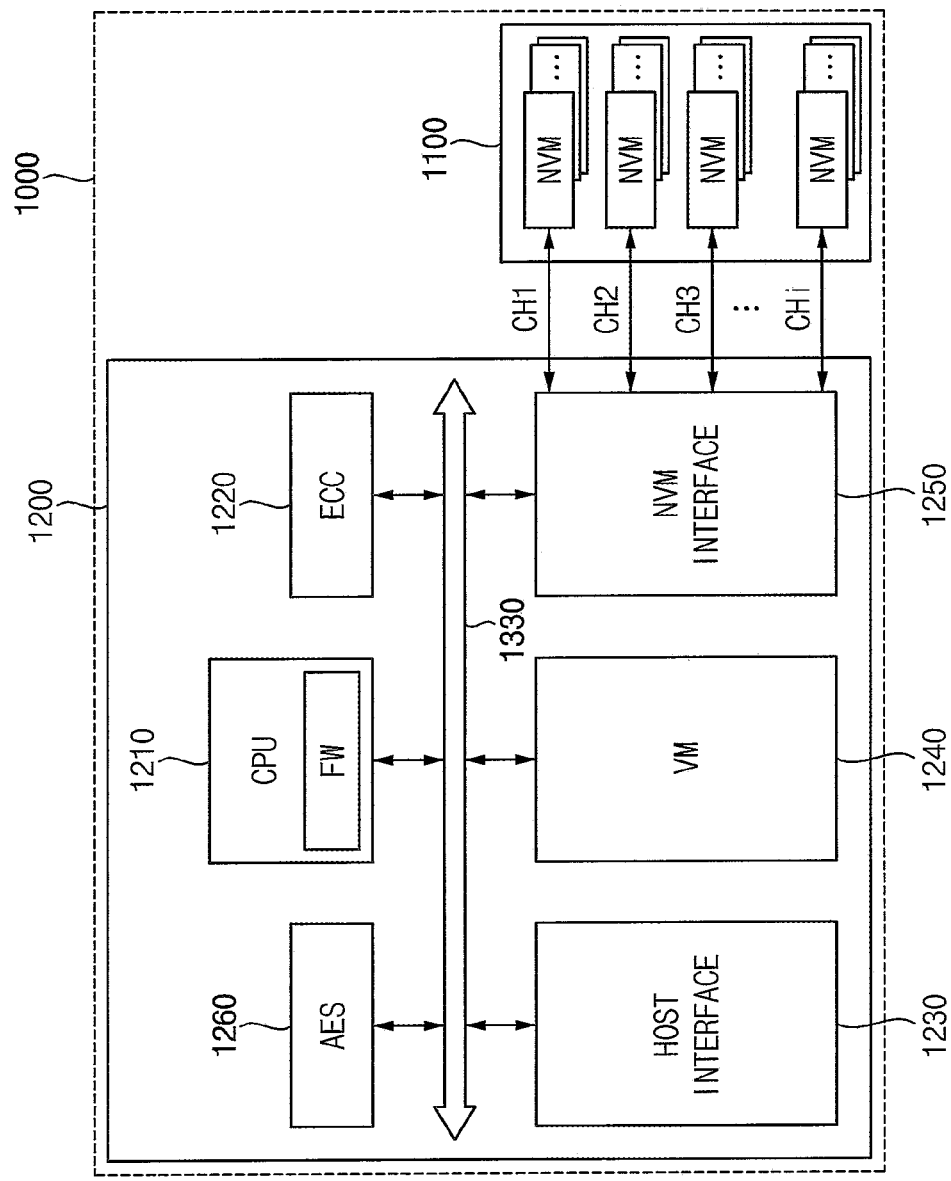
FIG. 29 is a conceptual diagram illustrating manufacture of a stacked semiconductor device according to some examples of embodiments.

FIG. 29 is a block diagram illustrating a memory system according to example embodiments.

Referring to FIG. 29, a memory system 1000 may include a multiple non-volatile memory devices (NVM) 1100 and a memory controller 1200. The memory system 1000 may be an embedded multimedia card (eMMC), a solid state drive (SSD), a universal flash storage (UFS), as examples. The memory system 1000 may be referred to as a storage device and the memory controller may be referred to as a storage controller.

The nonvolatile memory devices 1100 may be implemented with flash memory, ferroelectric random access memory (FRAM), phase-change random access memory (PRAM), magnetic random access memory (MRAM), etc.

The memory controller 1200 may be connected to the nonvolatile memory devices 1100 through multiple channels CH1 to CHi. The memory controller 1200 may include one or more processors 1210, an ECC block 1220, a host interface 1230, a volatile memory device VM 1240, a nonvolatile memory interface 1250 and an advanced encryption standard (AES) engine 1260.

The processor 1210 may be configured to control overall operations of the memory controller 1200. For example, the processor 1210 may operate firmware (FW) including a flash translation layer (FTL), etc. The FTL may perform various functions, e.g., address mapping, read calibration, error correction, etc.

The volatile memory device 1240 may store data used to drive the memory controller 1200. Although FIG. 29 illustrates an example embodiment where the volatile memory device 1240 is included in the memory controller 1200, the volatile memory device 1240 is not limited thereto. For example, the volatile memory device 1240 may be placed outside the memory controller 1200.

The ECC block 1220 may calculate error correction code values of data to be programmed at a writing operation, and may correct an error of read data using an error correction code value at a read operation.

The AES engine 1260 may perform encryption and decryption of data input to the memory controller 1200, using symmetric-key algorithm. For example, the AES engine 1260 may include an encryption module and a decryption module.

The host interface 1230 may provide a physical connection to a host device and the nonvolatile memory interface 1250 may provide a physical connection to the nonvolatile memory devices 1100. In some example embodiments, the nonvolatile memory devices 1100 may be implemented to observe standards such as Toggle, ONFI, etc.

Even though not illustrated in FIG. 29, the nonvolatile memory device 1100 may include a plurality of memory planes and a plurality of plane-dedicated pad sets, and the memory controller 1200 may include a plurality of host pad sets that are connected to a plurality of plane-dedicated pad sets included in the nonvolatile memory device, as described above with reference to FIGS. 1 through 25.

As described above, the nonvolatile memory device and the memory system according to some examples of embodiments may increase a bandwidth of a data transfer by reducing a data transfer delay and supporting a parallel data transfer through the plurality of plane-dedicated pad sets respectively assigned to the plurality of memory planes. In addition, the nonvolatile memory device and the memory system according to some examples of embodiments may decrease power consumption using the plurality of plane-dedicated pad sets respectively assigned to the plurality of memory planes by removing data multiplexing and/or signal routing.

The present inventive concepts may be applied to non-volatile memory devices and systems including the nonvolatile memory devices. For example, the present inventive concepts may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, or the like.

The foregoing is illustrative of some examples of embodiments and is not to be construed as limiting thereof.

Although only a few examples of embodiments have been described, those skilled in the art will readily appreciate that many modifications are possible to the examples of embodiments and the present inventive concepts without materially departing therefrom.

What is claimed is:

1. A nonvolatile memory device comprising:
a memory cell region including a first metal pad;
a peripheral circuit region including a second metal pad and vertically connected to the memory cell region by the first metal pad and the second metal pad;
a plurality of memory planes comprising a plurality of page buffer circuits and a plurality of memory cell arrays including nonvolatile memory cells stacked in a vertical direction to form cell strings, wherein the plurality of page buffer circuits are arranged in the peripheral circuit region, the plurality of memory cell arrays are arranged in the memory cell region, and wherein each of the plurality of page buffer circuits is connected through bitlines to ones of the nonvolatile memory cells included in a respective memory cell array of the plurality of memory cell arrays; and
a plurality of plane-dedicated pad sets connected to the plurality of page buffer circuits through a plurality of data paths such that each of the plurality of plane-dedicated pad sets is connected dedicatedly to a respective page buffer circuit of the plurality of page buffer circuits,
wherein each of the plurality of plane-dedicated pad sets comprises a plurality of data pads connected dedicatedly to the respective page buffer circuit, and
wherein the nonvolatile memory device is configured to receive commands and addresses from a memory controller through ones of the plurality of data pads included in at least one of the plurality of plane-dedicated pad sets.

2. The nonvolatile memory device of claim 1, wherein the plurality of data pads are configured to receive write data from the memory controller to provide to the respective page buffer circuit of the plurality of page buffer circuits and are configured to receive read data from the respective page buffer circuit of the plurality of page buffer circuits to provide to the memory controller.

3. The nonvolatile memory device of claim 2, wherein the plurality of plane-dedicated pad sets are configured to simultaneously receive write data corresponding to the plurality of memory planes from the memory controller and provide the write data corresponding to the plurality of memory planes respectively to the plurality of page buffer circuits, and
wherein the plurality of plane-dedicated pad sets are configured to simultaneously receive read data corresponding to the plurality of memory planes respectively from the plurality of page buffer circuits and provide the read data corresponding to the plurality of memory planes to the memory controller.

4. The nonvolatile memory device of claim 2, wherein a data path between a data pad included in a first plane-dedicated pad set of the plurality of plane-dedicated pad sets and the respective page buffer circuit does not include a multiplexer.

5. The nonvolatile memory device of claim 2, wherein the commands and addresses correspond to a first memory plane of the plurality of memory planes, and wherein the nonvolatile memory device is configured to receive the commands and the addresses corresponding to the first memory plane through the plane-dedicated pad set connected to the page buffer circuit of the first memory plane.

6. The nonvolatile memory device of claim 2, wherein the nonvolatile memory device is configured to receive the commands and the addresses from the memory controller via a portion of the plurality of plane-dedicated pad sets to perform a read operation or a write operation with respect to a portion of the plurality of memory planes corresponding to the portion of the plurality of plane-dedicated pad sets.

7. The nonvolatile memory device of claim 2, wherein the nonvolatile memory device is configured to receive a start address for a read operation or a write operation via a first plane-dedicated pad set of the plurality of plane-dedicated pad sets and is configured to receive an end address for the read operation or the write operation via a second plane-dedicated pad set of the plurality of plane-dedicated pad sets.

8. The nonvolatile memory device of claim 2, wherein the nonvolatile memory device is configured to receive the write data or output the read data via a first plane-dedicated pad set of the plurality of plane-dedicated pad sets, and is configured to receive or output feature information indicating an operational condition of the nonvolatile memory device through a second plane-dedicated pad set of the plurality of plane-dedicated pad sets.

9. The nonvolatile memory device of claim 2, wherein the nonvolatile memory device is configured to simultaneously receive the commands and the addresses via at least two of the plurality of plane-dedicated pad sets.

10. The nonvolatile memory device of claim 1, wherein the nonvolatile memory device is configured to perform a read operation with respect to a first portion of the plurality of memory planes respectively corresponding to a first portion of the plurality of plane-dedicated pad sets while the nonvolatile memory device performs a write operation with respect to a second portion of the plurality of memory planes respectively corresponding to a second portion of the plurality of plane-dedicated pad sets.

11. The nonvolatile memory device of claim 1, further comprising:
a plurality of plane-dedicated command-address decoders, each of the plurality of plane-dedicated command-address decoders configured to generate a control signal, a row address, and a column address that are applied independently to each of the plurality of memory planes based on commands and addresses received through a plurality of data pads included in each of the plurality of plane-dedicated pad sets.

12. The nonvolatile memory device of claim 1, wherein the plurality of plane-dedicated pad sets are in a center portion of the nonvolatile memory device, and wherein each of the plurality of plane-dedicated pad sets is adjacent to the respective memory plane of the plurality of memory planes.

13. A memory controller configured to control a nonvolatile memory device connected to the memory controller through a channel, the nonvolatile memory device including a plurality of memory planes that comprise a plurality of page buffer circuits and a plurality of memory cell arrays including nonvolatile memory cells stacked in a vertical direction to form cell strings, the memory controller comprising:
a processor configured to control operations of the memory controller; and
a plurality of host pad sets that are each dedicatedly connected to a respective one of a plurality of plane-dedicated pad sets included in the nonvolatile memory device, wherein each of the plurality of plane-dedicated pad sets is connected dedicatedly to a respective one of a plurality of memory planes included in the nonvolatile memory device, wherein each of the plurality of host pad sets includes a plurality of host data pads connected to a plurality of data pads included the plurality of plane-dedicated pad set corresponding to the host pad set, and wherein the memory controller is configured to transmit commands and addresses to the nonvolatile memory device through ones of the plurality of host data pads included in at least one of the plurality of host pad sets.

14. The memory controller of claim 13, wherein the memory controller is configured to transmit a start address for a read operation or a write operation via a first host pad set of the plurality of host pad sets and is configured to transmit an end address for the read operation or the write operation via a second host pad set of the plurality of host pad sets.

15. The memory controller of claim 13, wherein the memory controller is configured to transmit write data or receive read data via a first host pad set of the plurality of host pad sets, and is configured to transmit or receive feature information indicating an operational condition of the nonvolatile memory device through a second host pad set of the plurality of host pad sets.

16. The memory controller of claim 13, wherein the memory controller is configured to simultaneously transmit the commands and the addresses via at least two of the plurality of host pad sets.

17. The memory controller of claim 13, wherein a plane address is omitted from the addresses transmitted by the memory controller through the ones of the plurality of host data pads included in the at least one of the plurality of host pad sets.

18. The memory controller of claim 13, wherein the nonvolatile memory device is a first nonvolatile memory device of a plurality of nonvolatile memory devices connected to the memory controller through the channel.

19. A memory system comprising:
a nonvolatile memory device; and
a memory controller configured to control operations of the nonvolatile memory device,
wherein the nonvolatile memory device comprises:
   a plurality of memory planes comprising a plurality of page buffer circuits and a plurality of memory cell arrays including nonvolatile memory cells stacked in a vertical direction to form cell strings, wherein each of the plurality of page buffer circuits is connected through bitlines to ones of the nonvolatile memory cells included in a respective memory cell array of the plurality of memory cell arrays; and
   a plurality of plane-dedicated pad sets connected to the plurality of page buffer circuits through a plurality of data paths such that each of the plurality of plane-dedicated pad sets is connected dedicatedly to a respective page buffer circuit of the plurality of page buffer circuits, wherein each of the plurality of plane-dedicated pad sets comprises a plurality of data pads,
wherein the memory controller comprises:
   a plurality of host pad sets that are respectively connected to the plurality of plane-dedicated pad sets, wherein each of the plurality of host pad sets comprises a plurality of host data pads that are respectively connected to the plurality of data pads included in the plane-dedicated pad set that is respectively connected to the host pad set, and
wherein the memory controller is configured to simultaneously transmit a command and an address through the plurality of host data pads included in at least two of the plurality of host pad sets.

20. The memory system of claim 19, wherein the nonvolatile memory device is configured to simultaneously receive the command and the address through the plurality of data pads included in at least two of the plurality of plane-dedicated pad sets.

* * * * *